(12) United States Patent
Tanaka et al.

(10) Patent No.: US 10,177,724 B2
(45) Date of Patent: Jan. 8, 2019

(54) POWER AMPLIFIER CIRCUIT

(71) Applicant: Murata Manufacturing Co., Ltd., Kyoto (JP)

(72) Inventors: Satoshi Tanaka, Kyoto (JP); Kazuo Watanabe, Kyoto (JP); Takayuki Tsutsui, Kyoto (JP); Masao Kondo, Kyoto (JP); Satoshi Arayashiki, Kyoto (JP); Fumio Harima, Kyoto (JP); Masatoshi Hase, Kyoto (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

(21) Appl. No.: 15/600,993

(22) Filed: May 22, 2017

(65) Prior Publication Data

US 2017/0359038 A1    Dec. 14, 2017

(30) Foreign Application Priority Data

Jun. 14, 2016  (JP) .................... 2016-118183

(51) Int. Cl.
*H03F 3/04*    (2006.01)
*H03F 3/24*    (2006.01)
(Continued)

(52) U.S. Cl.
CPC .......... *H03F 3/245* (2013.01); *H03F 1/0205* (2013.01); *H03F 1/0272* (2013.01); *H03F 1/0277* (2013.01); *H03F 1/22* (2013.01); *H03F 1/565* (2013.01); *H03F 3/005* (2013.01); *H03F 3/195* (2013.01); *H03F 3/21* (2013.01); *H04L 5/0007* (2013.01); *H04L 5/14* (2013.01);
(Continued)

(58) Field of Classification Search
CPC ...................................... H03F 3/245
USPC ............... 330/300, 285, 311, 297, 310, 296
See application file for complete search history.

(56) References Cited

U.S. PATENT DOCUMENTS 7,242,253 B2 *  7/2007  Motta .............. H03F 1/22
                                                    330/311
9,667,200 B2 *  5/2017  Ripley ............. H03F 1/52
(Continued)

FOREIGN PATENT DOCUMENTS

CN    201716367 U    1/2011
JP    2000223963 A   8/2000
(Continued)

OTHER PUBLICATIONS

2013 IEEE International Meeting for Future of Electron Devices, Kansai, Evolution of Power Amplifier for mobile applications, Satoshi Tanaka, pp. 112-113.

*Primary Examiner* — Khanh V Nguyen
*Assistant Examiner* — Khiem Nguyen
(74) *Attorney, Agent, or Firm* — Pearne & Gordon LLP

(57) ABSTRACT

A power amplifier circuit includes first and second transistors and a first voltage output circuit. A radio frequency signal is input into a base of the first transistor. The first voltage output circuit outputs a first voltage in accordance with a power supply voltage. The first voltage is supplied to a base or a gate of the second transistor. An emitter or a source of the second transistor is connected to a collector of the first transistor. A first amplified signal generated by amplifying the radio frequency signal is output from a collector or a drain of the second transistor.

16 Claims, 18 Drawing Sheets

(51) Int. Cl.
*H03F 1/02* (2006.01)
*H03F 1/56* (2006.01)
*H03F 3/00* (2006.01)
*H03F 3/195* (2006.01)
*H03F 3/21* (2006.01)
*H04L 5/00* (2006.01)
*H04L 5/14* (2006.01)
*H03F 1/22* (2006.01)
*H04W 88/00* (2009.01)

(52) U.S. Cl.
CPC .. *H03F 2200/222* (2013.01); *H03F 2200/318* (2013.01); *H03F 2200/387* (2013.01); *H03F 2200/408* (2013.01); *H03F 2200/451* (2013.01); *H03F 2200/555* (2013.01); *H04W 88/00* (2013.01)

(56) References Cited

U.S. PATENT DOCUMENTS

| | | | |
|---|---|---|---|
| 2007/0229167 A1* | 10/2007 | Wu | H03F 1/22 330/296 |
| 2007/0296507 A1 | 12/2007 | Hamaguchi | |
| 2015/0171796 A1 | 6/2015 | Matsui | |
| 2015/0270806 A1* | 9/2015 | Wagh | H03F 3/211 330/296 |

FOREIGN PATENT DOCUMENTS

| | | |
|---|---|---|
| JP | 2008005160 A | 1/2008 |
| JP | 2015115835 A | 6/2015 |

* cited by examiner

POWER AMPLIFIER CIRCUIT

This application claims priority from Japanese Patent Application No. 2016-118183 filed on Jun. 14, 2016. The content of this application is incorporated herein by reference in its entirety.

BACKGROUND

The present disclosure relates to a power amplifier circuit. As a power amplifier circuit used in a mobile communication device, such as a cellular phone, "Evolution of Power Amplifier for mobile applications" Satoshi Tanaka, International Meeting for Future of Electron Devices, Kansai (IMFEDK), 2013 IEEE, pp 112-113 discloses a power amplifier circuit using a heterojunction bipolar transistor (HBT). Japanese Unexamined Patent Application Publication No. 2015-115835 discloses a power amplifier circuit including two cascode-connected HBTs.

BRIEF SUMMARY

Improving of the power-added efficiency in a power amplifier circuit is demanded. To meet this demand, the following technology is known. By boosting the power supply voltage, a load impedance in each amplifier is increased, thereby decreasing the impedance conversion ratio, which is a conversion ratio used for performing impedance matching with a subsequent device in an output matching circuit. As a result, the insertion loss and the return loss in the output matching circuit are reduced. This will be discussed more specifically. When the power supply voltage is about 3.4 V, in order to obtain linear output of about 28.5 dBm, about 4Ω of load impedance is required in an amplifier. In this case, the output matching circuit of the power amplifier circuit converts the load impedance (about 4Ω) of the amplifier into output impedance (about 50Ω, for example) of the power amplifier circuit, and thus, the impedance conversion ratio is about 12.5. If the output matching circuit is constituted by components of a surface mount device (SMD), such as a capacitor and an inductor, and a pattern on a module substrate, it is necessary that the loss in the components forming the output matching circuit be sufficiently smaller than about 4Ω in order to reduce the loss in the output matching circuit. When the power supply voltage is about 10.2 V, which is three times as high as the above-described power supply voltage, in order to obtain linear output of about 28.5 dBm, about 39Ω of load impedance is only required in an amplifier. The impedance conversion ratio in the output matching circuit is about 1.28, which is lower than the above-described impedance conversion ratio. In this case, it is only necessary that the loss in the components forming the output matching circuit be smaller than about 39Ω. In this manner, as a result of increasing the load impedance of an amplifier by boosting the power supply voltage, the loss in the output matching circuit can be reduced, thereby making it possible to improve the power-added efficiency of the power amplifier circuit.

However, in the power amplifier circuit disclosed in the above-described document "Evolution of Power Amplifier for mobile applications", the maximum power supply voltage is restricted due to the collector-base withstand voltage of the transistor. In the power amplifier circuit disclosed in the above-described publication, by cascode-connecting two transistors, the divided voltage is applied to each transistor, and thus, the maximum power supply voltage can be increased to be higher than that in the power amplifier circuit in the above-described document. However, the base voltage of the upper-stage transistor is fixed, and when the collector-base voltage of the upper-stage transistor exceeds the withstand voltage, the transistor is broken. The reliability of the power amplifier circuit is thus decreased.

The present disclosure has been made in view of the above-described background. The present disclosure provides a power amplifier circuit in which the power-added efficiency is improved while the reliability is being maintained.

According to an embodiment of the present disclosure, there is provided a power amplifier circuit including first and second transistors and a first voltage output circuit. A radio frequency signal is input into a base of the first transistor. The first voltage output circuit outputs a first voltage in accordance with a power supply voltage. The first voltage is supplied to a base or a gate of the second transistor. An emitter or a source of the second transistor is connected to a collector of the first transistor. A first amplified signal generated by amplifying the radio frequency signal is output from a collector or a drain of the second transistor.

According to an embodiment of the present disclosure, it is possible to provide a power amplifier circuit in which the power-added efficiency is improved while the reliability is being maintained.

Other features, elements, characteristics and advantages of the present disclosure will become more apparent from the following detailed description of embodiments of the present disclosure with reference to the attached drawings.

DETAILED DESCRIPTION

Figure 1:
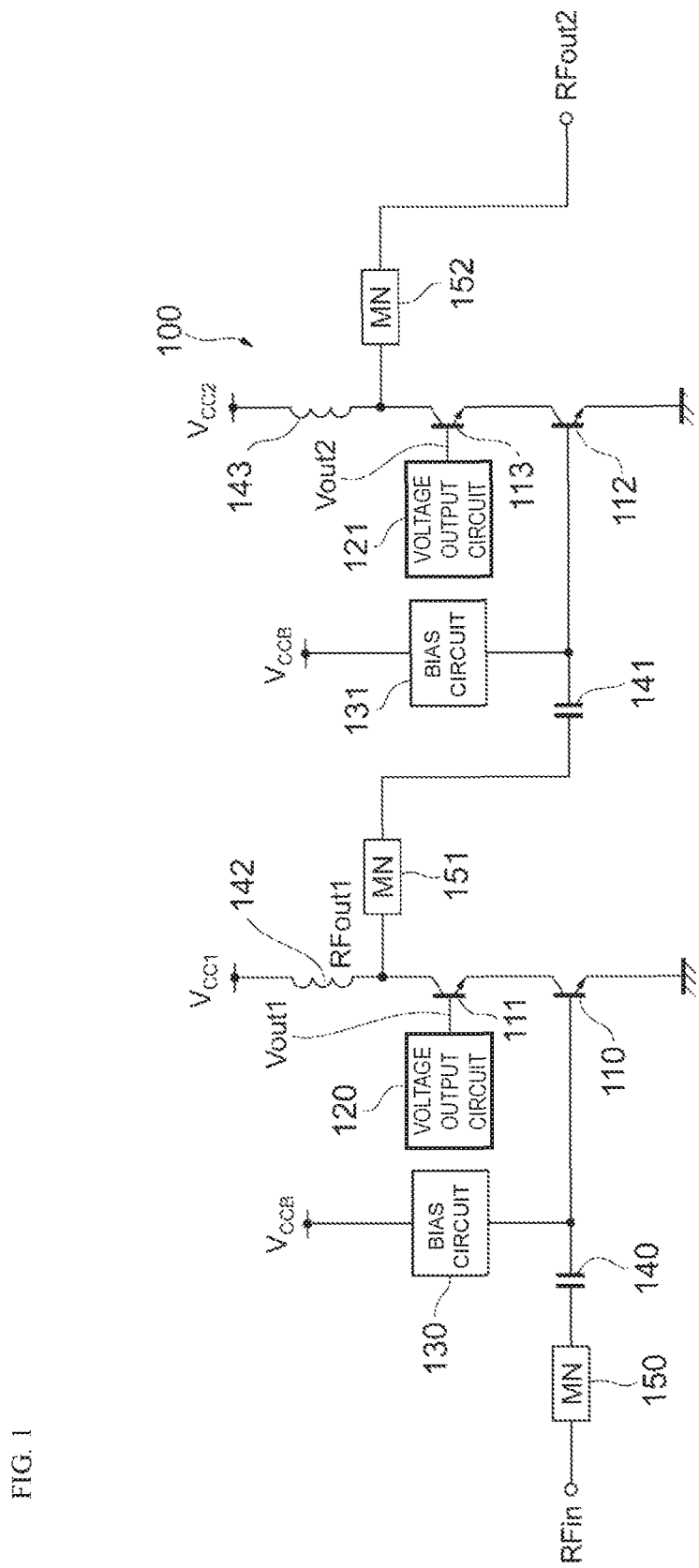
FIG. 1 illustrates an example of the configuration of a power amplifier circuit according to a first embodiment of the disclosure.

Embodiments of the present disclosure will be described below in detail with reference to the accompanying drawings. The same element is designated by like reference numeral, and an explanation thereof will be given only once and will not be repeated.

FIG. 1 illustrates an example of the configuration of a power amplifier circuit 100 according to a first embodiment of the disclosure. In a mobile communication device, such as a cellular phone, the power amplifier circuit 100 amplifies an input radio frequency (RF) signal RFin and outputs an amplified signal RFout2. The frequency of the RF signal RFin is about several gigahertz, for example.

As shown in FIG. 1, the power amplifier circuit 100 includes bipolar transistors 110, 111, 112, and 113, voltage output circuits 120 and 121, bias circuits 130 and 131, capacitors 140 and 141, inductors 142 and 143, and matching circuits 150, 151, and 152.

The power amplifier circuit 100 includes two-stage amplifiers. The first-stage amplifier (drive stage) includes the bipolar transistors 110 and 111, while the second-stage amplifier (power stage) includes the bipolar transistors 112 and 113. Hereinafter, each pair of the bipolar transistors 110 and 111 and the bipolar transistors 112 and 113 may also be called an amplifier. The drive stage amplifies the RF signal RFin input via the matching circuit 150 and outputs an amplified signal RFout1 (first amplified signal). The amplified signal RFout1 is input into the power stage via the matching circuit 151. The power stage amplifies the amplified signal RFout1 and outputs the amplified signal RFout2 via the matching circuit 152.

The collector of the bipolar transistor 110 (first transistor) is connected to the emitter of the bipolar transistor 111 (second transistor), the base of the bipolar transistor 110 is connected to one end of the capacitor 140, and the emitter thereof is grounded. The RF signal RFin and a bias current output from the bias circuit 130 are supplied to the base of the bipolar transistor 110. Similarly, the collector of the bipolar transistor 112 (sixth transistor) is connected to the emitter of the bipolar transistor 113 (seventh transistor), the base of the bipolar transistor 112 is connected to one end of the capacitor 141, and the emitter thereof is grounded. The amplified signal RFout1 and a bias current output from the bias circuit 131 are supplied to the base of the bipolar transistor 112. Gain characteristics of the bipolar transistors 110 and 112 may be controlled in accordance with the bias currents supplied from the bias circuits 130 and 131, respectively.

The bipolar transistor 111 (second transistor) is cascode-connected to the bipolar transistor 110, while the bipolar transistor 113 (seventh transistor) is cascode-connected to the bipolar transistor 112. More specifically, a power supply voltage $V_{CC1}$ is supplied to the collector of the bipolar transistor 111 via the inductor 142. The base of the bipolar transistor 111 is connected to the voltage output circuit 120, and the emitter thereof is connected to the collector of the bipolar transistor 110. The amplified signal RFout1 (first amplified signal) amplified by the bipolar transistor 110 is output from the collector of the bipolar transistor 111. Similarly, a power supply voltage $V_{CC2}$ is supplied to the collector of the bipolar transistor 113 via the inductor 143. The base of the bipolar transistor 113 is connected to the voltage output circuit 121, and the emitter thereof is connected to the collector of the bipolar transistor 112. The amplified signal (second amplified signal) amplified by the bipolar transistor 112 is output from the collector of the bipolar transistor 113.

By cascode-connecting the bipolar transistors 110 and 111, the voltage applied between the collector and the emitter of each of the bipolar transistors 110 and 111 is a voltage obtained by dividing the power supply voltage $V_{CC1}$. It is thus possible to increase the value of the voltage $V_{CC1}$ by about twice as high as that when the bipolar transistor 111 is not connected to the bipolar transistor 110. More specifically, if the collector-emitter withstand voltage of each of the bipolar transistors 110 and 111 is about 6 V, the power supply voltage $V_{CC1}$ can be increased to about 12 V. The bipolar transistors 112 and 113 of the power stage are similar to the bipolar transistors 110 and 111 of the drive stage, and a detailed explanation thereof will thus be omitted.

The size of the bipolar transistor 111 may be smaller than the bipolar transistor 110. Although two cascode-connected bipolar transistors are shown in FIG. 1, three or more bipolar transistors may be cascode-connected. In this case, the voltage obtained by dividing the power supply voltage $V_{CC1}$ by the number of bipolar transistors is applied between the collector and the emitter of each bipolar transistor. The maximum permissible power supply voltage is thus further increased.

The voltage output circuit 120 (first voltage output circuit) and the voltage output circuit 121 (second voltage output circuit) respectively generate an output voltage Vout1 (first voltage) and an output voltage Vout2 (second voltage) in accordance with the power supply voltages $V_{CC1}$ and $V_{CC2}$, and respectively supply the output voltages Vout1 and Vout2 to the bases of the bipolar transistors 111 and 113. The base voltages of the bipolar transistors 111 and 113 thus adaptively change in accordance with the values of the power supply voltages $V_{CC1}$ and $V_{CC2}$. Unlike the configuration in which the base voltage of the upper-stage transistor is fixed, as disclosed in Japanese Unexamined Patent Application Publication No. 2015-115835, each of the power supply voltages $V_{CC1}$ and $V_{CC2}$ is substantially equally divided into the collector-emitter voltages of the plural cascode-connected bipolar transistors. With this configuration, it is possible to further increase the power supply voltages $V_{CC1}$ and $V_{CC2}$ to be higher than in the configuration disclosed in this publication. Details of the configuration of the voltage output circuits 120 and 121 will be discussed later.

The bias circuits 130 and 131 generate a bias current or a bias voltage and supply it to the bases of the bipolar transistors 110 and 112, respectively.

Figure 2:
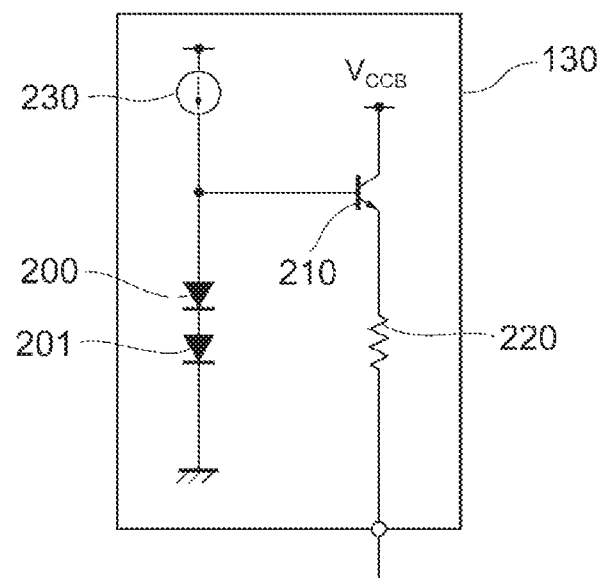
FIG. 2 illustrates an example of the configuration of a bias circuit.

FIG. 2 illustrates an example of the configuration of the bias circuit 130. The configuration of the bias circuit 131 is similar to that of the bias circuit 130, and a detailed explanation thereof will thus be omitted. As shown in FIG. 2, the bias circuit 130 includes diodes 200 and 201, a bipolar transistor 210, a resistor element 220, and a current source 230.

The diodes 200 and 201 and the current source 230 generate a predetermined level of voltage. This will be explained more specifically. The diodes 200 and 201 are connected in series with each other. A constant current is supplied from the current source 230 to the anode of the diode 200, and the cathode of the diode 201 is grounded. The anode of the diode 200 is connected to the base of the bipolar transistor 210. A predetermined level of voltage (about 2.6 V, for example) is generated in the base of the bipolar transistor 210. Instead of the diodes 200 and 201, bipolar transistors whose collector and base are connected to each other may be used. Such a bipolar transistor may be used instead of diodes 320 and 720, which will be discussed later.

A power supply voltage $V_{CCB}$ is supplied to the collector of the bipolar transistor 210. The base of the bipolar transistor 210 is connected to the anode of the diode 200, and the emitter thereof is connected to one end of the resistor element 220. The bipolar transistor 210 supplies a bias current from the emitter to the base of the bipolar transistor 110 via the resistor element 220.

Referring back to FIG. 1, the capacitors 140 and 141 remove direct current (DC) components of a RF signal. The inductors 142 and 143 are choke inductors that suppress the coupling of a high-frequency signal to a power supply circuit.

The matching circuits 150, 151, and 152 are provided for performing impedance matching between corresponding circuits. The matching circuits 150, 151, and 152 are each constituted by inductors and capacitors, for example. As discussed above, as the power supply voltages $V_{CC1}$ and $V_{CC2}$, voltages (about 12 V, for example) equal to or higher than the collector-emitter withstand voltages of the bipolar transistors 110 and 112 may be supplied to the matching circuits 151 and 152. By boosting the power supply voltage to be relatively high, the load impedance of an amplifier is increased, and the above-described impedance conversion ratio is accordingly decreased, thereby reducing the loss of the RF signal in the matching circuits 151 and 152.

Figure 3:
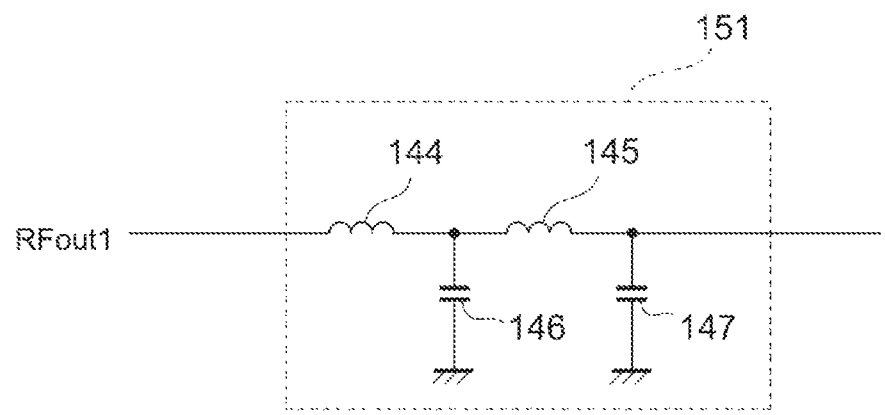
FIG. 3 illustrates an example of the configuration of a matching circuit.

FIG. 3 illustrates an example of the configuration of the matching circuit 151. The configuration of the matching circuit 152 is similar to that of the matching circuit 151, and a detailed explanation thereof will thus be omitted. As shown in FIG. 3, the matching circuit 151 includes inductors 144 and 145 and capacitors 146 and 147.

The amplified signal RFout1 is input into one end of the inductor 144, and the other end thereof is connected to one end of the capacitor 146. One end of the inductor 145 is connected to the other end of the inductor 144, and the other end thereof is connected to one end of the capacitor 147. The other ends of the capacitors 146 and 147 are grounded. With this configuration, a pair of the inductor 144 and the capacitor 146 and a pair of the inductor 145 and the capacitor 147 each forms a low pass filter. The matching circuit 151 shown in FIG. 3 includes plural low pass filters. However, the matching circuit may be configured differently, for example, it may include high pass filters or a combination of a low pass filter and a high pass filter.

With the above-described configuration, in the power amplifier circuit 100, bipolar transistors forming an amplifier are cascode-connected to each other, and thus, the voltage obtained by dividing the power supply voltage by the number of bipolar transistors is applied between the collector and the emitter of each bipolar transistor. The output voltages Vout1 and Vout2 supplied to the bases of the bipolar transistors 111 and 113 respectively change in accordance with the power supply voltages $V_{CC1}$ and $V_{CC2}$, so that each of the power supply voltages $V_{CC1}$ and $V_{CC2}$ can be substantially equally divided into the voltages applied to the cascode-connected bipolar transistors. This makes it possible to supply higher voltages to the amplifiers as the power supply voltages $V_{CC1}$ and $V_{CC2}$ than in the configuration in which bipolar transistors are not cascode-connected to each other. If the number of cascode-connected bipolar transistors is N (N is a natural number), a voltage substantially N times as high as that in the above-described configuration can be supplied to each amplifier as the power supply voltage. As a result, it is possible to improve the power-added efficiency of the power amplifier circuit while suppressing a breakdown of the bipolar transistors, for example.

The power supply voltages $V_{CC1}$ and $V_{CC2}$ respectively supplied to the amplifiers via the inductors 142 and 143 may be generated by a buck-boost converter (buck-boost DC-to-DC converter). As the power supply voltage $V_{CCB}$ supplied to the bias circuits 130 and 131, a battery voltage may be used.

Figure 4:
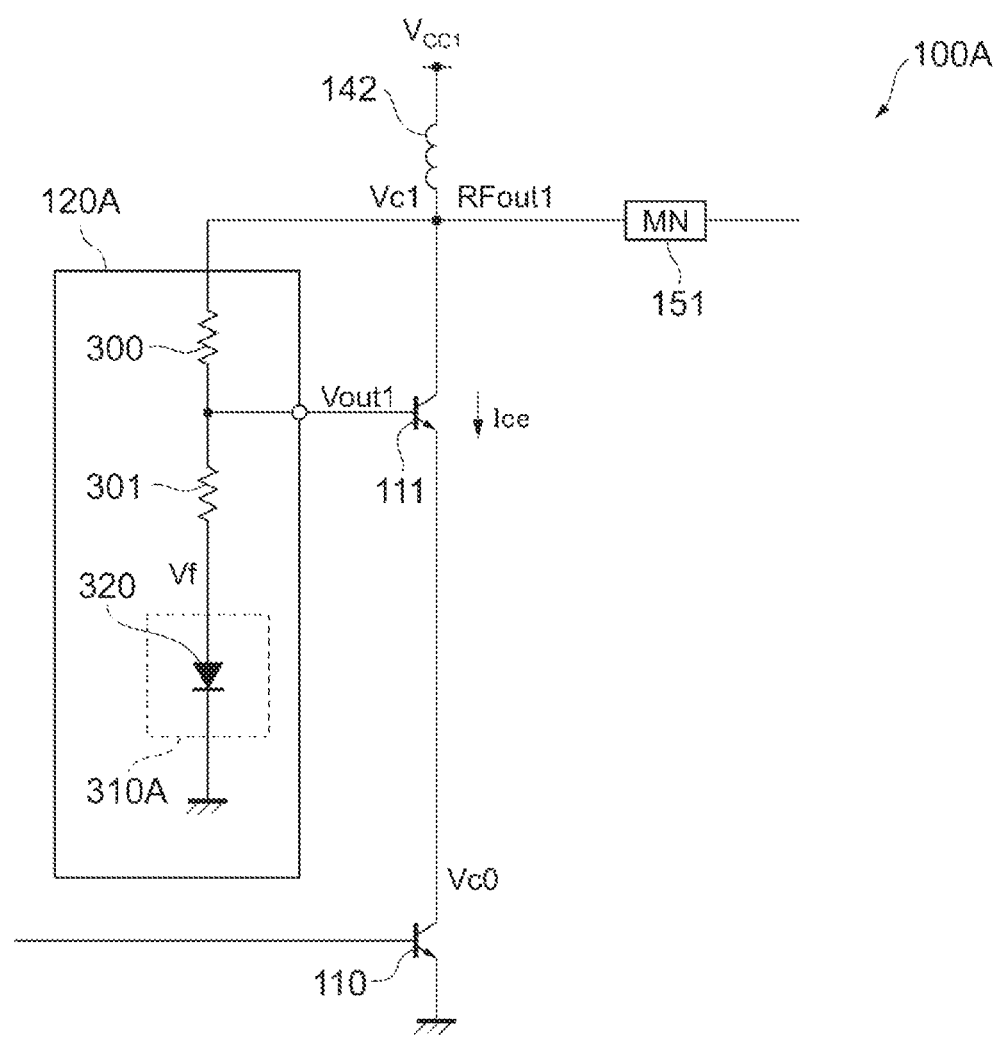
FIG. 4 illustrates an example of the configuration of a voltage output circuit in an example of the power amplifier circuit shown in FIG. 1.

FIG. 4 illustrates an example of the configuration of the voltage output circuit 120 (voltage output circuit 120A) in a power amplifier circuit 100A, which is an example of the power amplifier circuit 100. For the sake of representation, among the elements forming the power amplifier circuit 100A, the voltage output circuit 120A, the bipolar transistors 110 and 111, the inductor 142, and the matching circuit 151 are only shown in FIG. 4. FIGS. 6 and 8 through 12 are also illustrated in a similar manner. The same elements as those of the power amplifier circuit 100 are designated by like reference numerals, and an explanation thereof will be omitted.

The voltage output circuit 120A includes resistor elements 300 and 301 and a limiter circuit 310A. The limiter circuit 310A includes a diode 320.

The resistor elements 300 and 301 (first and second resistor elements) are connected in series with each other. One end of the resistor element 300 is connected to a portion closer to the power supply (one end of the inductor 142), and the other end of the resistor element 301 is connected to a portion closer to a ground (anode of the diode 320). A node between the resistor elements 300 and 301 is connected to the base of the bipolar transistor 111. The diode 320 is connected in series with the resistor elements 300 and 301. The anode of the diode 320 is connected to the other end of the resistor element 301, and the cathode thereof is grounded.

With the above-described configuration, the voltage obtained by dividing the collector voltage Vc1 (which varies in accordance with the power supply voltage $V_{CC1}$) of the bipolar transistor 111 in accordance with the resistance values of the resistor elements 300 and 301 is output from the voltage output circuit 120A as the output voltage Vout1 (first voltage). Adjusting of the resistance values of the resistor elements 300 and 301 can change the distribution ratio of the voltages applied to the bipolar transistors 110 and 111. A forward voltage of the diode 320 of the limiter circuit 310A is added to the output voltage Vout1. More specifically, when the resistance values of the resistor elements 300 and 301 are respectively represented by r1 and r2, and when the forward voltage of the diode 320 is represented by Vf, the output voltage Vout1 output from the voltage output circuit 120A is expressed by Vout1=(r2/(r1+r2))×Vc1+Vf. Thus, in the voltage output circuit 120A, the provision of the limiter circuit 310A makes it possible to maintain the output voltage Vout1 at a predetermined level or higher even when the collector voltage Vc1 of the bipolar transistor 111 is reduced. More specifically, the output voltage Vout1 is controlled so that the base-emitter voltage of the bipolar transistor 111 may be equal to or higher than the on-state voltage. The on-state voltage is a base-emitter voltage when a bipolar transistor changes from OFF to ON. The bipolar transistor 111 is maintained in the ON state even with a decrease in the power supply voltage $V_{CC1}$, thereby fulfilling the effect of cascode-connecting the bipolar transistors 110 and 111. Hereinafter, the function of controlling the output voltage Vout1 at a predetermined level or higher, which is performed by the limiter circuit 310A, will be called a limiter function.

Figure 5:
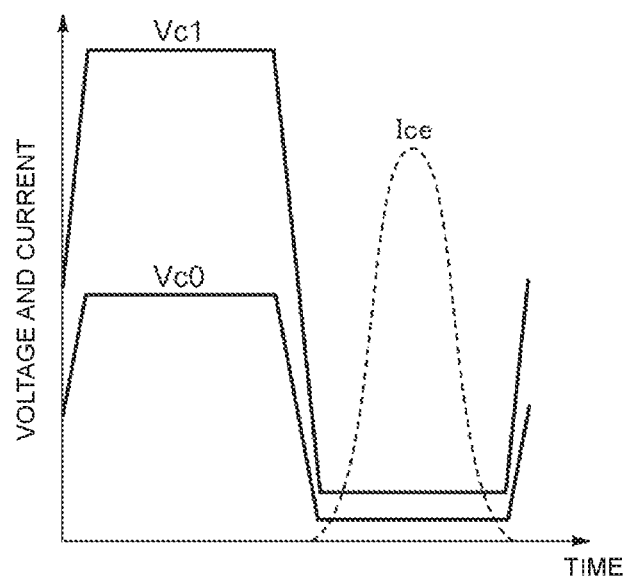
FIG. 5 is a graph illustrating voltage and current waveforms in the power amplifier circuit shown in FIG. 4.

FIG. 5 is a graph illustrating voltage and current waveforms in the power amplifier circuit 100A. More specifically, this graph illustrates collector voltages Vc0 and Vc1 (indicated by the solid lines) of the bipolar transistors 110 and 111, respectively, and a collector-emitter current Ice (indicated by the dashed line) of the bipolar transistor 111 in the power amplifier circuit 100A shown in FIG. 4. The collector-emitter current Ice of the bipolar transistor 110 is substantially the same as that of the bipolar transistor 111 shown in FIG. 5. In FIG. 5, the vertical axis indicates the voltage and the current, while the horizontal axis indicates the time.

FIG. 5 shows that, by cascode-connecting the bipolar transistors 110 and 111, the collector voltage Vc1 of the bipolar transistor 111 is about twice as high as the collector voltage Vc0 of the bipolar transistor 110. This also validates that the power amplifier circuit 100A is capable of supplying, as the power supply voltage $V_{CC1}$, a voltage about twice as high as that in a power amplifier circuit without necessarily the bipolar transistor 111. The operation mode of the amplifier is not limited to a specific mode. The amplifier may operate such that the voltage waveform and the current waveform do not overlap each other and the power consumption (=voltage × current) becomes ideally 0, as shown in FIG. 5.

Figure 6:
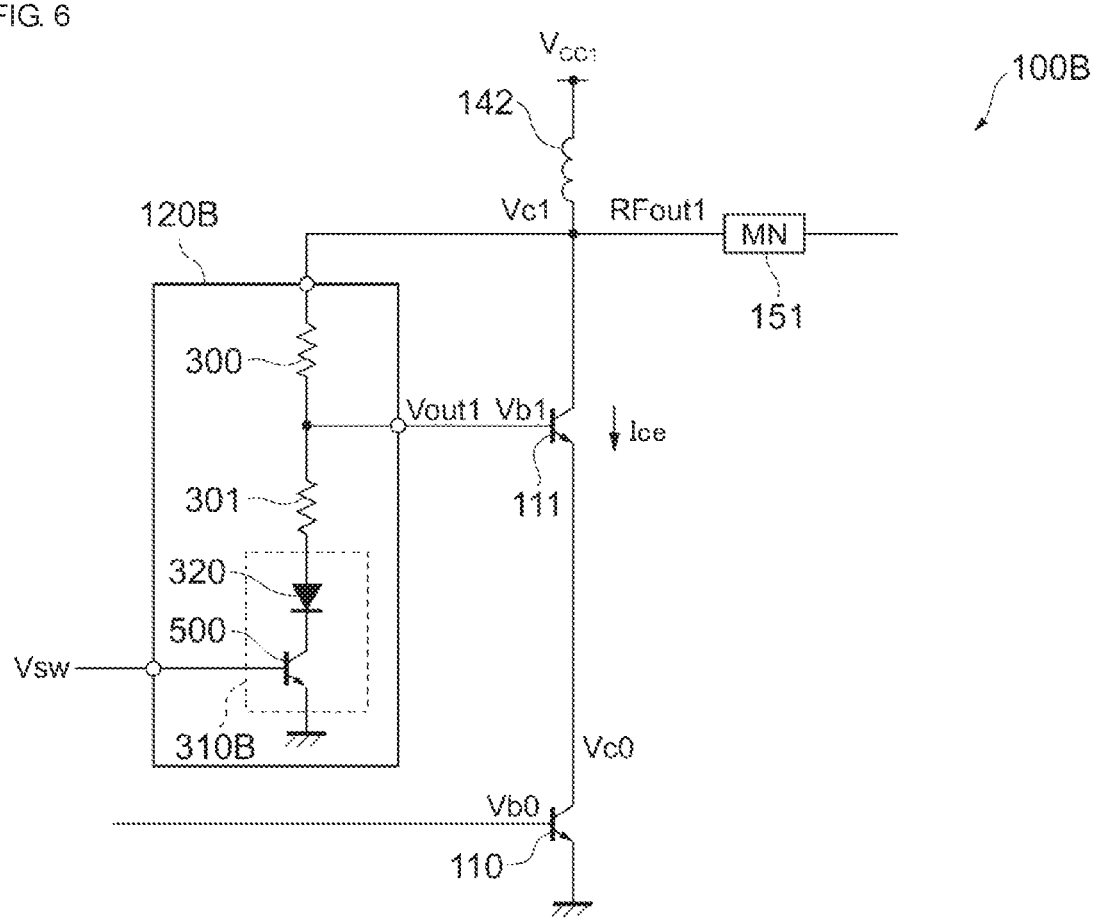
FIG. 6 illustrates an example of the configuration of a voltage output circuit in an example of the power amplifier circuit shown in FIG. 1.

FIG. 6 illustrates an example of the configuration of the voltage output circuit 120 (voltage output circuit 120B) in a power amplifier circuit 100B, which is an example of the power amplifier circuit 100. The same elements as those of the power amplifier circuit 100A are designated by like reference numerals, and an explanation thereof will be omitted. The voltage output circuit 120B is different from the voltage output circuit 120A in that it includes a limiter circuit 310B instead of the limiter circuit 310A. The limiter circuit 310B includes a bipolar transistor 500 in addition to the diode 320.

The bipolar transistor 500 (third transistor) is connected in series with the diode 320. More specifically, the collector of the bipolar transistor 500 is connected to the cathode of the diode 320, a control voltage Vsw (control signal) is supplied to the base thereof, and the emitter thereof is grounded. The bipolar transistor 500 is turned ON in accordance with the control voltage Vsw, and the collector-emitter voltage of the bipolar transistor 500 is added to the output voltage Vout1 (first voltage).

Figure 7:
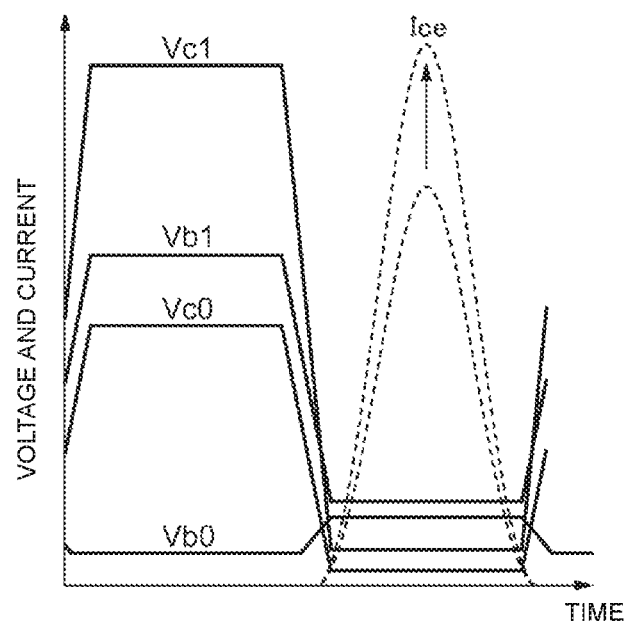
FIG. 7 is a graph illustrating voltage and current waveforms in the power amplifier circuit shown in FIG. 6.

FIG. 7 is a graph illustrating voltage and current waveforms in the power amplifier circuit 100B. More specifically, this graph illustrates collector voltages Vc0 and Vc1 and base voltages Vb0 and Vb1 (indicated by the solid lines) of the bipolar transistors 110 and 111, respectively, and a collector-emitter current Ice (indicated by the dashed line) of the bipolar transistor 111 in the power amplifier circuit 100B shown in FIG. 6. The collector-emitter current Ice of the bipolar transistor 110 is substantially the same as that of the bipolar transistor 111 shown in FIG. 7. In FIG. 7, the vertical axis indicates the voltage and the current, while the horizontal axis indicates the time. FIG. 7 shows a state in which the amplifier operates substantially under the maximum output power in response to input of a high level signal.

The collector voltage Vc1 of the bipolar transistor 111 varies in accordance with the amplitude of a RF signal, and drops to a minimum value expressed by the sum (about 0.6 V, for example) of the minimum value (about 0.3 V, for example) of the collector-emitter voltage of the bipolar transistor 110 and the minimum value (about 0.3 V, for example) of the collector-emitter voltage of the bipolar transistor 111. The output voltage Vout1 output from the voltage output circuit 120B drops in accordance with a change in the collector voltage Vc1. Due to a drop in the base voltage Vb1 of the bipolar transistor 111, the current supply capability of the bipolar transistor 111 is decreased, thereby reducing the collector-emitter current Ice. This decreases output power of the amplified signal RFout1 output from the collector of the bipolar transistor 111. The collector voltage Vc1 of the bipolar transistor 111 is substantially 180° out of phase with the base voltage Vb0 of the bipolar transistor 110. That is, when the base voltage Vb0 of the bipolar transistor 110 rises in accordance with the amplitude of the RF signal, the collector voltage Vc1 and the base voltage Vb1 of the bipolar transistor 111 drop. It is thus particularly important to control the base voltage Vb1 of the bipolar transistor 111 when a high level signal is input.

In the voltage output circuit 120B, the collector-emitter voltage of the bipolar transistor 500 is added to the output voltage Vout1. A decrease in the output voltage Vout1 is thus less likely to occur than in the voltage output circuit 120A shown in FIG. 4. Even when the amplifier outputs the maximum power, the collector-emitter current Ice is less likely to decrease, and output power of the bipolar transistor 111 is more likely to be maintained (see FIG. 7). By operating the bipolar transistor 500 as a switch, it is possible to stop a current from flowing through the voltage output circuit 120B when the amplifier is OFF, thereby reducing the standby current in the power amplifier circuit 100B when the amplifier is OFF.

Figure 8:
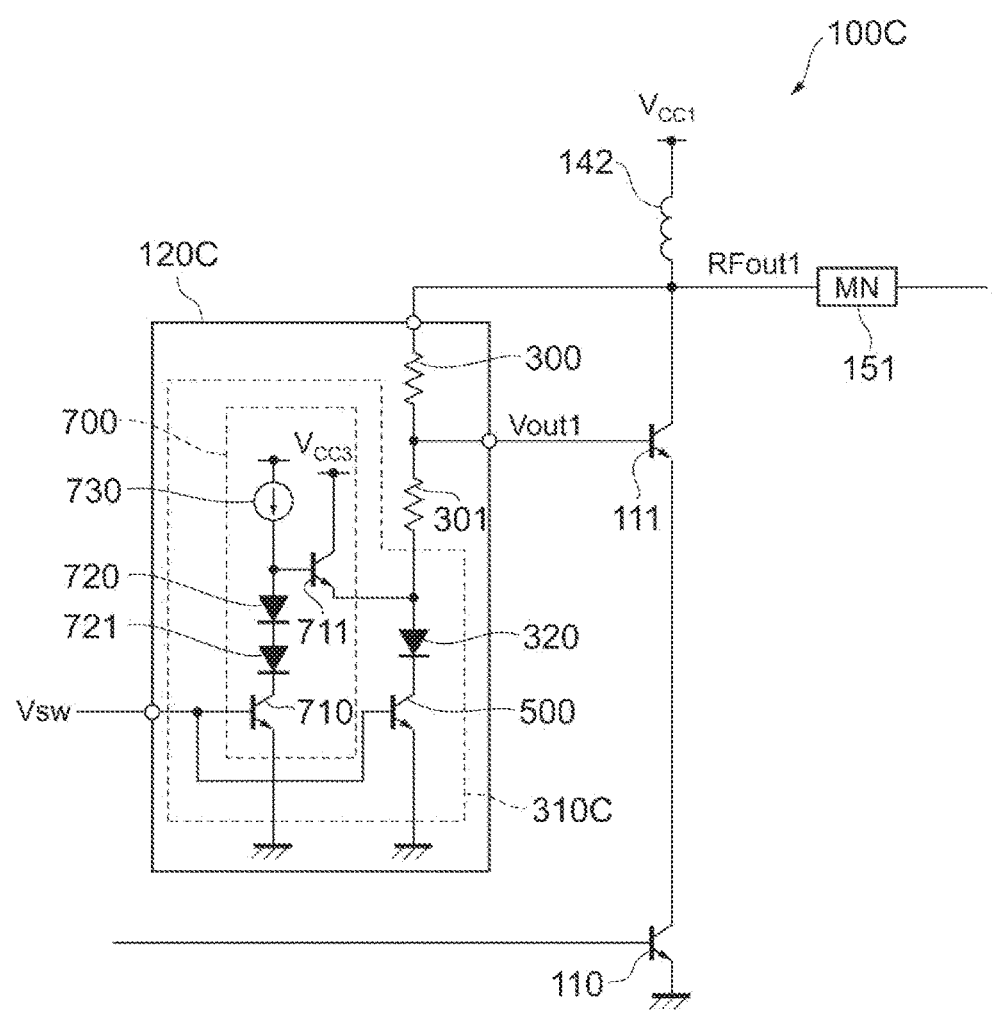
FIG. 8 illustrates an example of the configuration of a voltage output circuit in an example of the power amplifier circuit shown in FIG. 1.

FIG. 8 illustrates an example of the configuration of the voltage output circuit 120 (voltage output circuit 120C) in a power amplifier circuit 100C, which is an example of the power amplifier circuit 100. The same elements as those of the power amplifier circuit 100A are designated by like reference numerals, and an explanation thereof will be omitted. The voltage output circuit 120C is different from the voltage output circuit 120B in that it includes a limiter circuit 310C instead of the limiter circuit 310B. The limiter circuit 310C includes a current output circuit 700 in addition to the diode 320 and the bipolar transistor 500 of the limiter circuit 310B.

The current output circuit 700 includes bipolar transistors 710 and 711, diodes 720 and 721, and a current source 730.

The collector of the bipolar transistor 710 is connected to the cathode of the diode 721, a control voltage Vsw is supplied to the base thereof, and the emitter thereof is grounded. The bipolar transistor 710 is connected in parallel with the bipolar transistor 500. The bipolar transistor 710 is turned ON when the bipolar transistor 500 is turned ON in accordance with the control voltage Vsw. The bipolar transistor 710 serves as a switch which allows a current to flow through the bipolar transistor 711.

A power supply voltage $V_{CC3}$ is supplied to the collector of the bipolar transistor 711 (fourth transistor). The base of the bipolar transistor 711 is connected to the anode of the diode 720, and the emitter thereof is connected to the anode of the diode 320. When the bipolar transistor 710 is ON, a constant current is supplied from the current source 730 to the base of the bipolar transistor 711, and the bipolar transistor 711 outputs a predetermined current (first current) from the emitter.

The diodes 720 and 721 are connected in series with each other. A constant current is supplied from the current source 730 to the anode of the diode 720, and the cathode of the diode 721 is connected to the collector of the bipolar transistor 710.

In the voltage output circuits 120A and 120B (see FIGS. 4 and 6), when the collector voltage Vc1 of the bipolar transistor 111 is reduced and approaches the ON-state voltage (about 1.3 V, for example) of the diode 320, the diode 320 is turned OFF. This may decrease the limiter function of the limiter circuits 310A and 310B. In contrast, in the voltage output circuit 120C, when the bipolar transistor 500 is turned ON, an additional current (first current) is supplied from the emitter of the bipolar transistor 711 to the diode 320. Consequently, even with a sharp fluctuation in the amplitude of a RF signal in response to input of a high level signal, the diode 320 is not turned OFF. The limiter function of the limiter circuit 310C is thus maintained, and the output voltage is less likely to be reduced.

Figure 9:
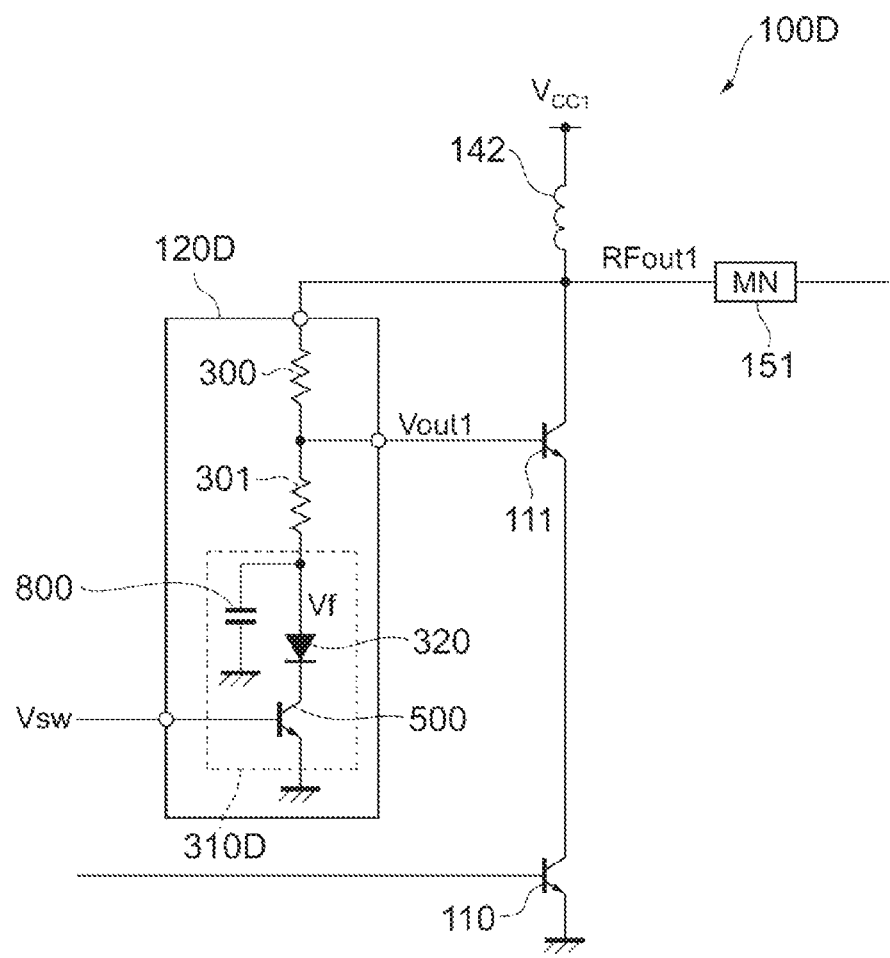
FIG. 9 illustrates an example of the configuration of a voltage output circuit in an example of the power amplifier circuit shown in FIG. 1.

FIG. 9 illustrates an example of the configuration of the voltage output circuit 120 (voltage output circuit 120D) in a power amplifier circuit 100D, which is an example of the power amplifier circuit 100. The same elements as those of the power amplifier circuit 100A are designated by like reference numerals, and an explanation thereof will be omitted. The voltage output circuit 120D is different from the voltage output circuit 120B in that it includes a limiter circuit 310D instead of the limiter circuit 310B. The limiter circuit 310D includes a capacitor 800 in addition to the diode 320 and the bipolar transistor 500 of the limiter circuit 310B.

The capacitor 800 is connected in parallel with the diode 320. One end of the capacitor 800 (first capacitor) is connected to the anode of the diode 320, while the other end thereof is grounded. With this configuration, a RF signal which is accidentally input into the voltage output circuit 120D is alternating current (AC)-grounded by the capacitor 800 and is attenuated before being applied to the diode 320. It is thus less likely that the forward voltage Vf of the diode 320 will vary in accordance with the amplitude of the RF signal. In the limiter circuit 310D, as well as in the limiter circuit 310C shown in FIG. 8, the diode 320 is not turned OFF. The limiter function of the limiter circuit 310D when a high level signal is input is maintained, and the base voltage of the bipolar transistor 111 is not excessively reduced. As a result, the output voltage is less likely to be reduced.

Figure 10:
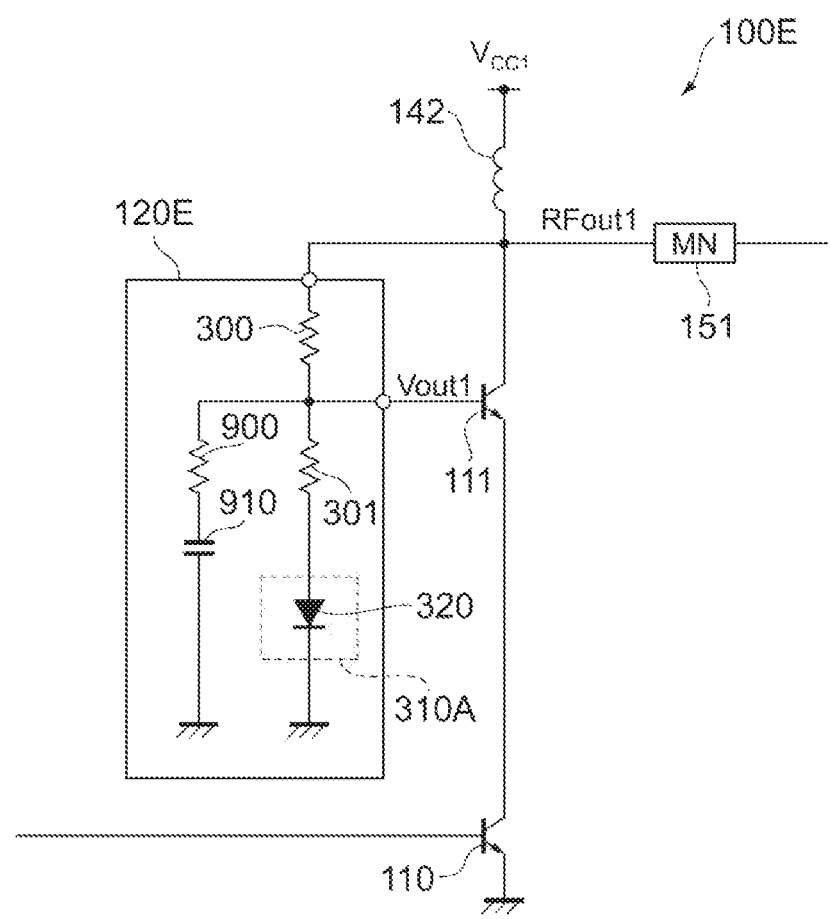
FIG. 10 illustrates an example of the configuration of a voltage output circuit in an example of the power amplifier circuit shown in FIG. 1.

FIG. 10 illustrates an example of the configuration of the voltage output circuit 120 (voltage output circuit 120E) in a power amplifier circuit 100E, which is an example of the power amplifier circuit 100. The same elements as those of the power amplifier circuit 100A are designated by like reference numerals, and an explanation thereof will be omitted. The voltage output circuit 120E is different from the voltage output circuit 120A in that it includes a resistor element 900 and a capacitor 910 in addition to the elements of the power amplifier circuit 100A.

The resistor element 900 (third resistor element) and the capacitor 910 (second capacitor) are connected in series with each other between a ground and a node between the resistor elements 300 and 301. More specifically, one end of the resistor element 900 is connected to the node between the resistor elements 300 and 301, and the other end thereof is connected to one end of the capacitor 910. One end of the capacitor 910 is connected to the other end of the resistor element 900, and the other end thereof is grounded.

In the voltage output circuit 120E, adjusting of the resistance value of the resistor element 900 and the capacitance value of the capacitor 910 can independently set the division ratio of the DC voltage and that of the AC voltage of the output voltage Vout1. The fluctuation in the amplitude of the output voltage Vout1 can thus be controlled. It is thus less likely that output power will be reduced when a high level signal is input, as in the voltage output circuit 120C shown in FIG. 8.

Figure 11:
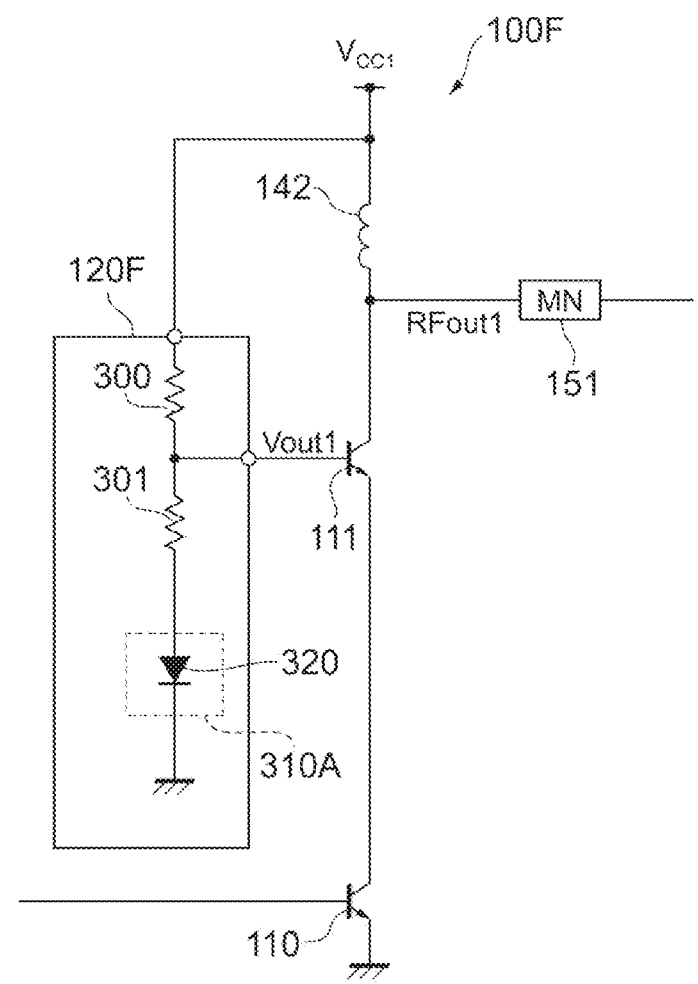
FIG. 11 illustrates an example of the configuration of a voltage output circuit in an example of the power amplifier circuit shown in FIG. 1.

FIG. 11 illustrates an example of the configuration of the voltage output circuit 120 (voltage output circuit 120F) in a power amplifier circuit 100F, which is an example of the power amplifier circuit 100. The same elements as those of the power amplifier circuit 100A are designated by like reference numerals, and an explanation thereof will be omitted.

The voltage output circuit 120F is different from the voltage output circuit 120A shown in FIG. 4 in that the power supply voltage $V_{CC1}$ is directly supplied to one end of the resistor element 300, instead of connecting one end of the resistor element 300 to one end of the inductor 142. With this configuration, the DC voltage of the output voltage Vout1 is divided by the resistor elements 300 and 301, while the AC voltage thereof is divided in accordance with the capacitance ratio, such as the ratio between the base-collector capacitance and the base-emitter capacitance of the bipolar transistor 111. As in the voltage output circuit 120E shown in FIG. 10, the division ratio of the DC voltage and that of the AC voltage of the output voltage Vout1 can be independently set. It is thus less likely that output power will be reduced when a high level signal is input. The power supply voltage $V_{CC1}$ may directly be supplied to one end of the resistor element 300 in the power amplifier circuits 100A through 100E, 100G, and 100H shown in FIGS. 4, 6, 8, 9, 10, 12, and 13.

Figure 12:
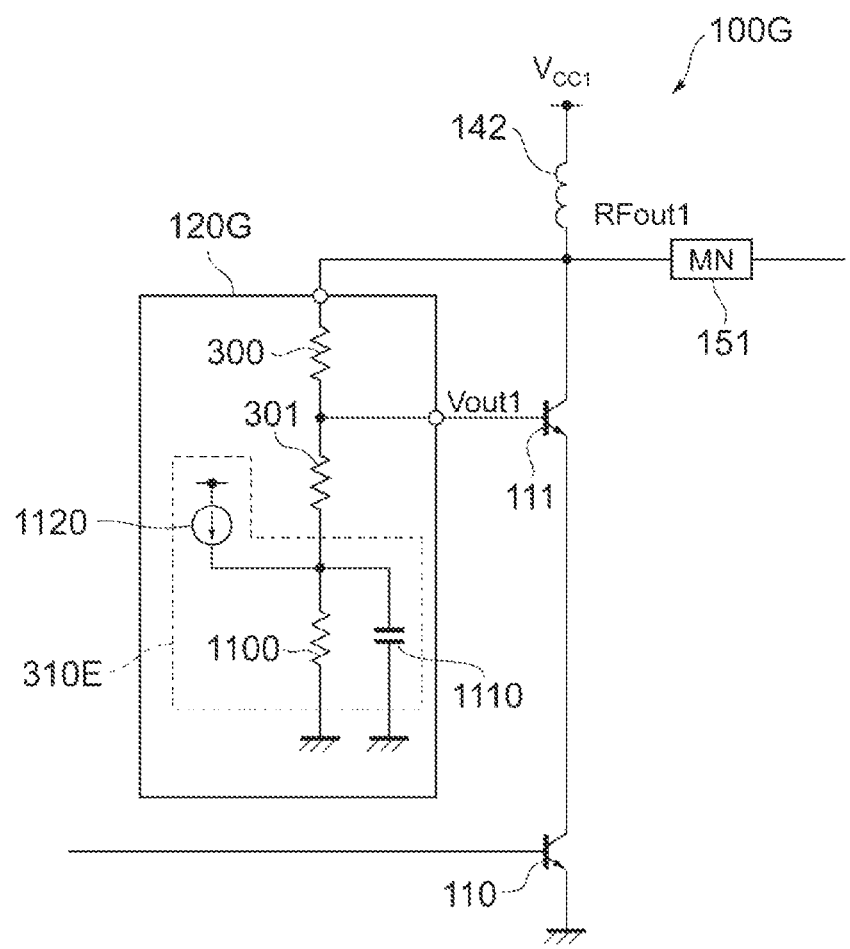
FIG. 12 illustrates an example of the configuration of a voltage output circuit in an example of the power amplifier circuit shown in FIG. 1.

FIG. 12 illustrates an example of the configuration of the voltage output circuit 120 (voltage output circuit 120G) in a power amplifier circuit 100G, which is an example of the power amplifier circuit 100. The same elements as those of the power amplifier circuit 100A are designated by like reference numerals, and an explanation thereof will be omitted. The voltage output circuit 120G is different from the voltage output circuit 120A in that it includes a limiter circuit 310E instead of the limiter circuit 310A. The limiter circuit 310E includes a resistor element 1100, a capacitor 1110, and a current source 1120.

One end of the resistor element 1100 is connected to the other end of the resistor element 301, and the other end thereof is grounded. A constant current supplied from the current source 1120 flows through the resistor element 1100. One end of the capacitor 1110 is connected to the other end of the resistor element 301, and the other end thereof is grounded.

A limiter circuit may include a load element, such as the resistor element 1100 shown in FIG. 12, instead of the diode 320. Causing a constant current to flow through the load element maintains the voltage at the other end of the resistor element 301 at a predetermined level or higher, and the limiter function can be fulfilled. In the limiter circuit 310E, the provision of the capacitor 1110 may be omitted if a current flows through the resistor element 1100. More specifically, the resistor element 1100 and a switch circuit (a bipolar transistor, for example) may be connected in series with each other, and the switch circuit may switch ON and OFF a current flowing through the resistor element 1100.

Figure 13:
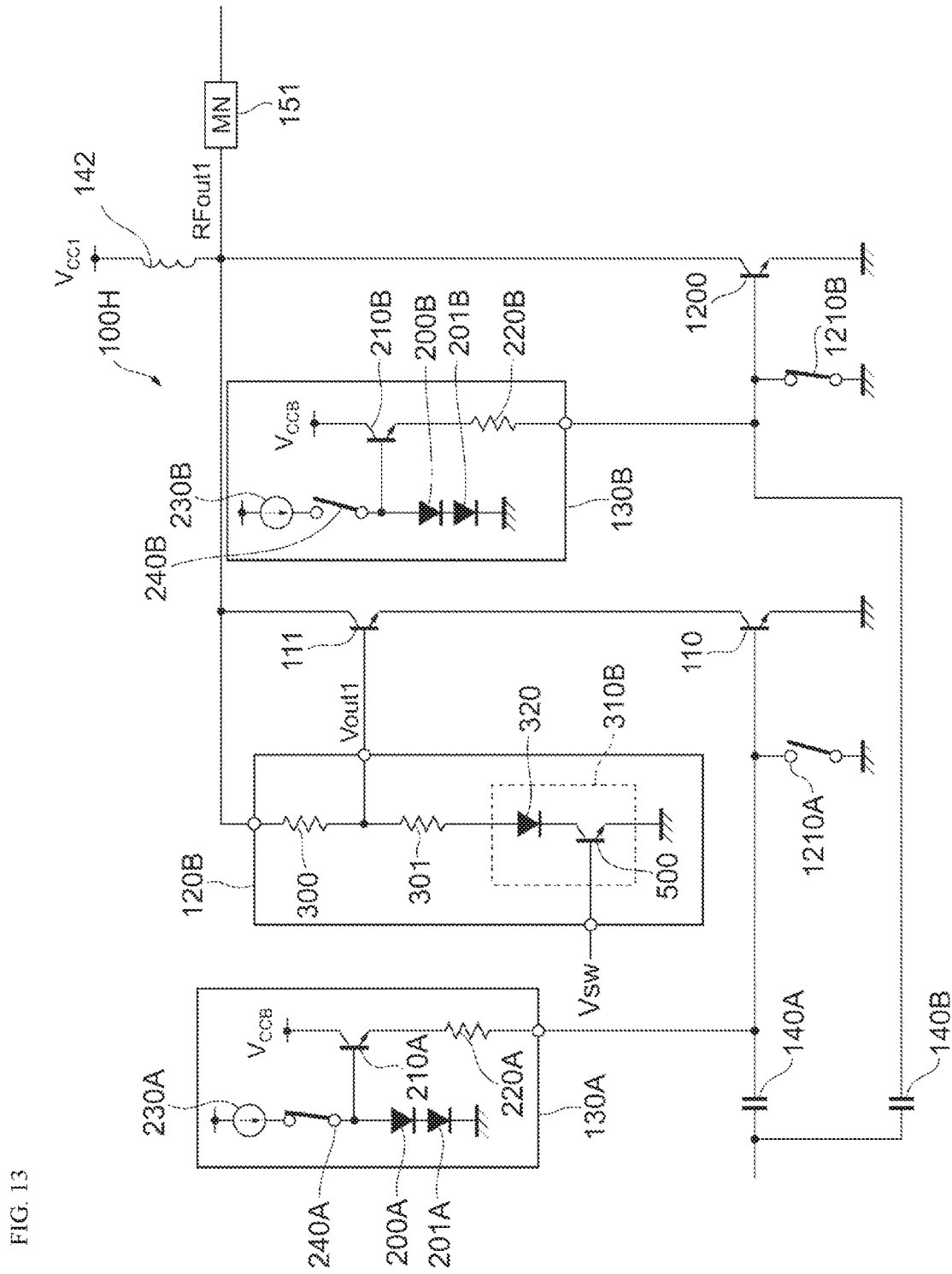
FIG. 13 illustrates another example of the configuration of the power amplifier circuit according to the first embodiment.

FIG. 13 illustrates another example of the configuration of the power amplifier circuit 100 (power amplifier circuit 100H) according to the first embodiment. For the sake of representation, among the elements forming the power amplifier circuit 100H, elements related to the drive-stage amplifier are only shown in FIG. 13. The same elements as those of the power amplifier circuit 100A are designated by like reference numerals, and an explanation thereof will be omitted. The power amplifier circuit 100H is different from the power amplifier circuit 100A in that it includes an amplifier (without necessarily a cascode-connected bipolar transistor) connected in parallel with the amplifier (with cascode-connected bipolar transistors) shown in FIG. 6.

More specifically, the power amplifier circuit 100H includes a bipolar transistor 1200, bias circuits 130A and 130B, capacitors 140A and 140B, and switch circuits 1210A and 1210B, in addition to the elements forming the power amplifier circuit 100B shown in FIG. 6. The bias circuits 130A and 130B (first and second bias circuits) respectively include switch circuits 240A and 240B, in addition to the elements forming the bias circuit 130 shown in FIG. 2.

The bipolar transistor 1200 (fifth transistor) is connected in parallel with the bipolar transistor 110, and amplifies the RF signal RFin and outputs the amplified signal RFout1, as in the bipolar transistor 110. However, the bipolar transistor 1200 is not cascode-connected to another bipolar transistor.

The bias circuits 130A and 130B respectively generate bias currents (first and second bias currents) and supply them to the bases of the bipolar transistors 110 and 1200. The switch circuits 240A and 240B (second switch circuit) complementarily switch ON and OFF the bipolar transistors 110 and 1200 so as to stop the supply of a bias current to the bipolar transistor 110 or 1200 that is not operated. FIG. 13 shows a state in which the bipolar transistor 110 is ON and the bipolar transistor 1200 is OFF. The withstand voltage of a bipolar transistor which is OFF is higher than that which is ON, thereby further increasing the power supply voltage $V_{CC1}$. The capacitors 140A and 140B remove DC components of a RF signal.

The switch circuits 1210A and 1210B connect or disconnect the bases of the bipolar transistors 110 and 1200 with or from a ground so as to switch ON and OFF the bipolar transistors 110 and 1200. More specifically, the switch circuit corresponding to the bipolar transistor that is ON is turned OFF, while the switch circuit corresponding to the bipolar transistor that is OFF is turned ON. As discussed above, the bias circuits 130A and 130B may switch ON and OFF the amplifiers, and the power amplifier circuit 100H may not necessarily include the switch circuits 1210A and 1210B.

In a power amplifier circuit used in a mobile communication device, such as a cellular phone, the level of output power changes in accordance with the amplitude of a RF signal. In the case of cellular phones supporting the third generation (3G) or the fourth generation (4G) of wireless communication systems, the gain varies in a range of about 80 dB, and the power supply voltage may change in accordance with the gain. For example, when the power amplifier circuit outputs the maximum power, the power supply voltage is relatively high (about 10 V, for example). When the power amplifier circuit outputs power of about 0 dBm or lower, the power supply voltage is relatively low (about 1 V, for example). When the power supply voltage $V_{CC1}$ is low, the power amplifier circuit 100A shown in FIG. 4 may not operate properly. For example, if the collector voltage Vc1 of the bipolar transistor 111 is about 1 V, the base voltage Vb1 thereof is about 1 V or lower. If the ON-state voltage of the bipolar transistor 111 is about 1.3 V, the bipolar transistor 111 is turned OFF. This eliminates the effect of cascode-connecting the bipolar transistor 111.

In contrast, in the power amplifier circuit 100H shown in FIG. 13, the switch circuits 240A and 240B of the bias circuits 130A and 130B complementarily switch ON and OFF the bipolar transistors 110 and 1200. When the power supply voltage $V_{CC1}$ is a high value (second level), the amplifier with cascode-connected bipolar transistors is operated, and when the power supply voltage $V_{CC1}$ is a low value (first level), the amplifier without necessarily a cascode-connected bipolar transistor is operated. That is, the power amplifier circuit 100H is capable of switching the amplifier which will operate in accordance with a change in the power supply voltage $V_{CC1}$. This increases the operating range of the power supply voltage supported by the power amplifier circuit 100H to be wider than that by the power amplifier circuit 100A. Additionally, the withstand voltage of a bipolar transistor is further increased by reducing the impedance of the base of the bipolar transistor. As a result of the switch circuits 1210A and 1210B complementarily switching ON and OFF the bipolar transistors 110 and 1200, the base of the bipolar transistor that is not operated is grounded, thereby further increasing the power supply voltage $V_{CC1}$.

Figure 14:
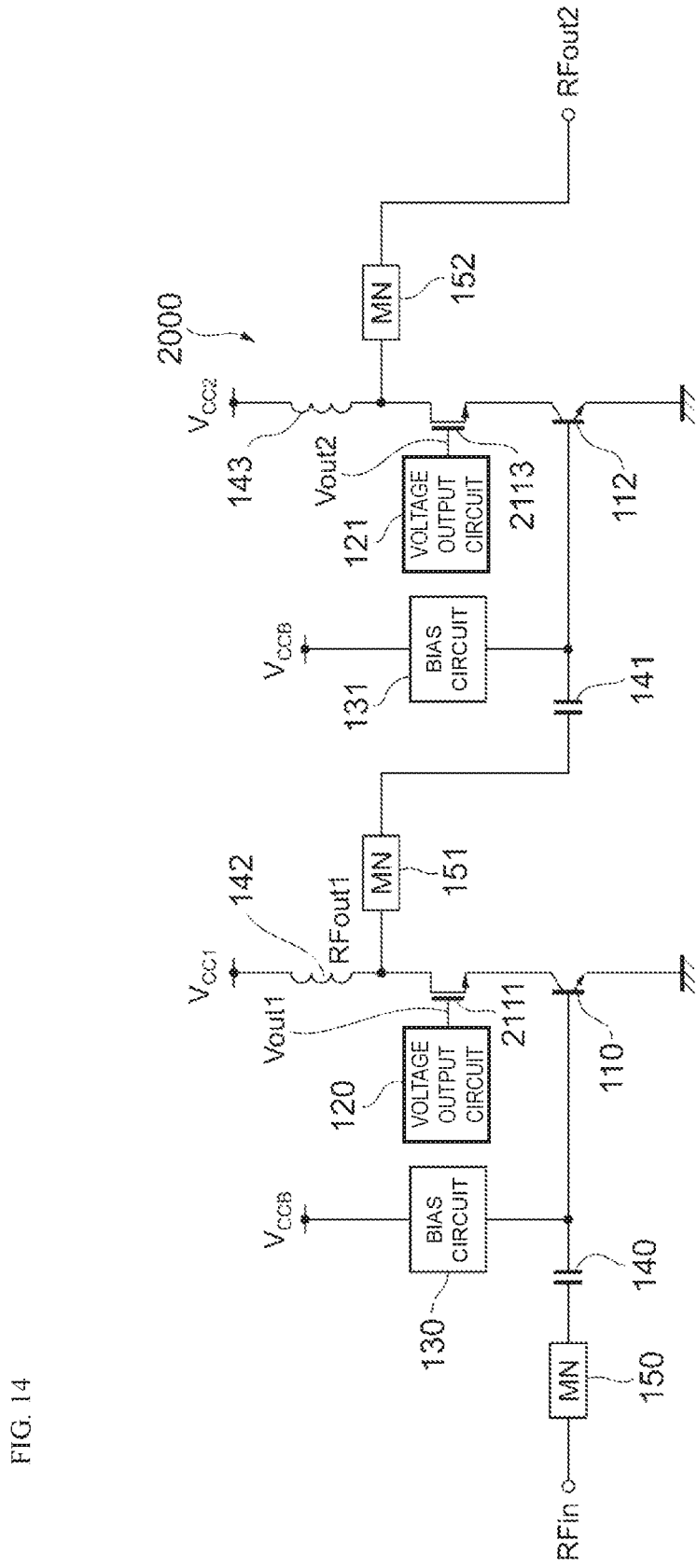
FIG. 14 illustrates an example of the configuration of a power amplifier circuit according to a second embodiment of the disclosure.

FIG. 14 illustrates an example of the configuration of a power amplifier circuit 2000 according to a second embodiment of the disclosure. The same elements as those shown in FIG. 1 are designated by like reference numerals, and an explanation thereof will be omitted. The power amplifier circuit 2000 is different from the power amplifier circuit 100 in that, as the upper-stage cascode-connected transistors, field-effect transistors (FETs) 2111 and 2113 are used instead of the bipolar transistors 111 and 113.

The FET 2111 (second transistor) is cascode-connected to the bipolar transistor 110. The FET 2113 (seventh transistor) is cascode-connected to the bipolar transistor 112. This will be discussed more specifically. A power supply voltage $V_{CC1}$ is supplied to the drain of the FET 2111 via the inductor 142. The gate of the FET 2111 is connected to the voltage output circuit 120, and the source thereof is connected to the collector of the bipolar transistor 110. A signal amplified by the bipolar transistor 110 is output from the drain of the FET 2111. A power supply voltage $V_{CC2}$ is supplied to the drain of the FET 2113 via the inductor 143. The gate of the FET 2113 is connected to the voltage output circuit 121, and the source thereof is connected to the collector of the bipolar transistor 112. A signal amplified by the bipolar transistor 112 is output from the drain of the FET 2113. Effects of a FET used as an upper-stage transistor will be explained with reference to FIG. 15.

Figure 15:
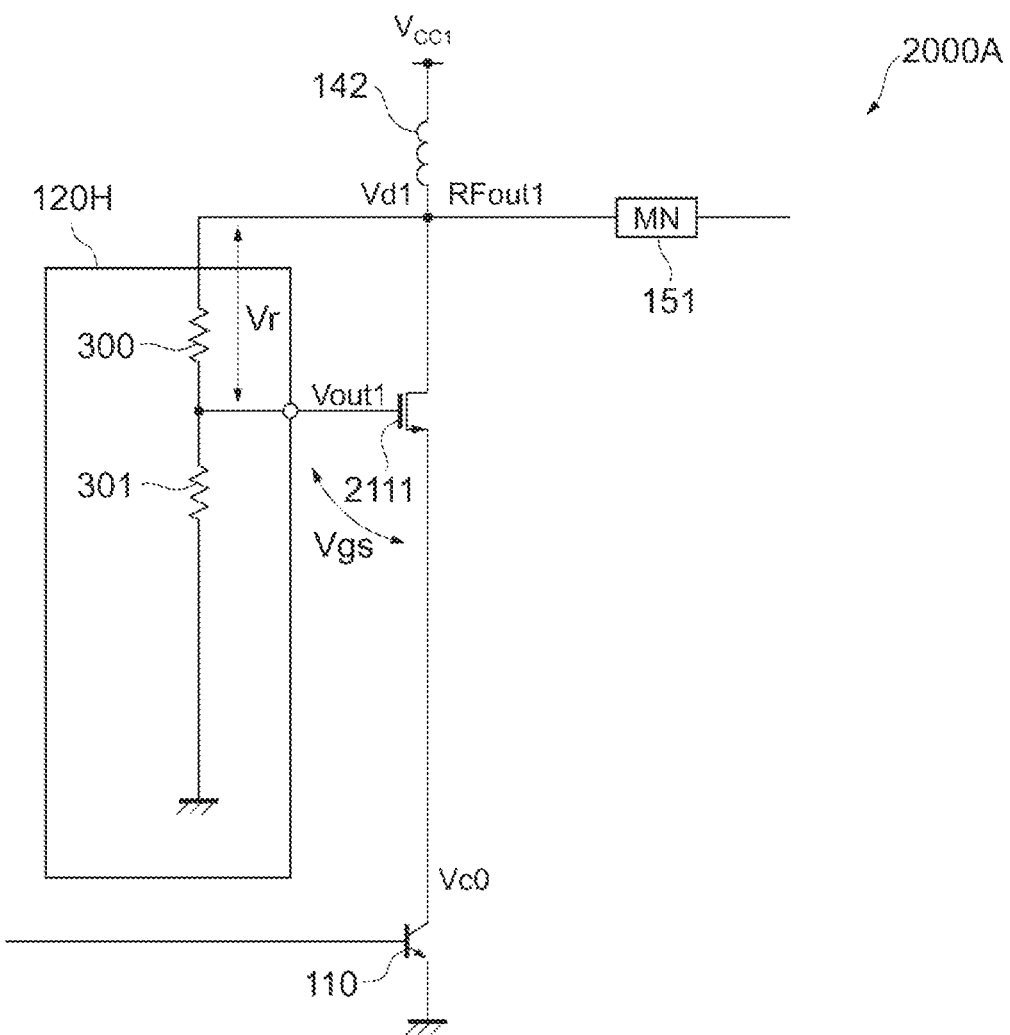
FIG. 15 illustrates an example of the configuration of a voltage output circuit in an example of the power amplifier circuit shown in FIG. 14.
Figure 17:
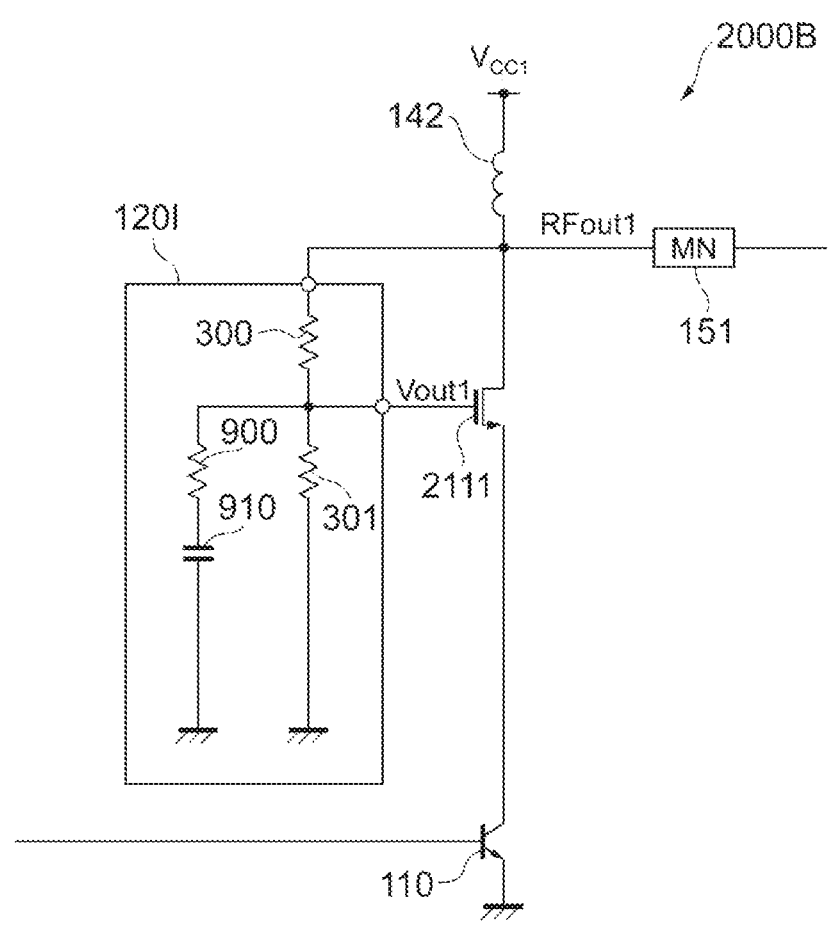
FIG. 17 illustrates an example of the configuration of a voltage output circuit in an example of the power amplifier circuit shown in FIG. 14.
Figure 18:
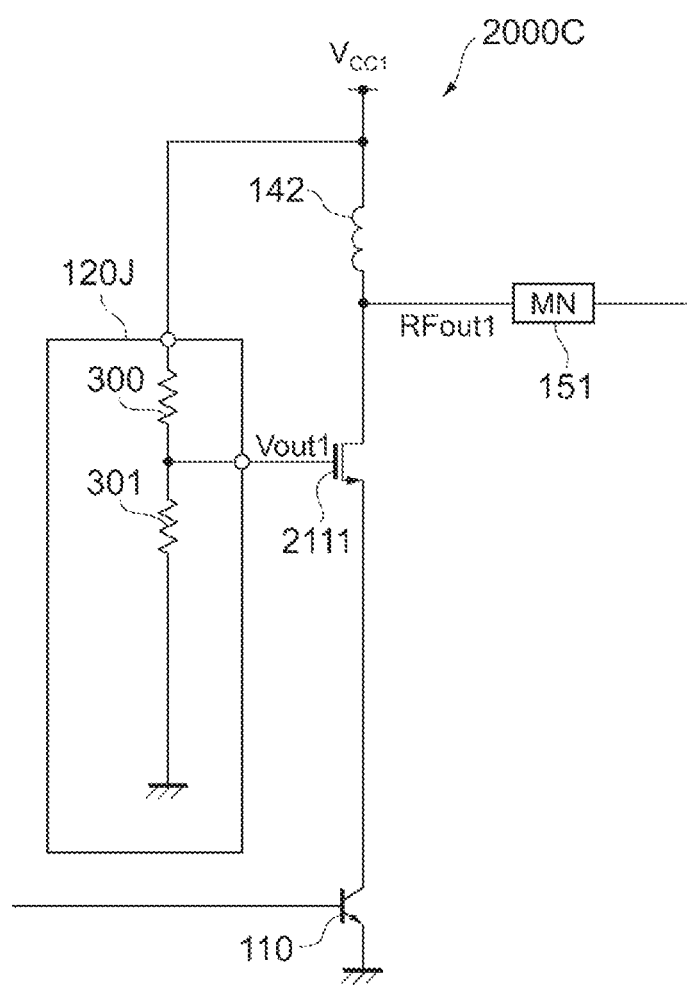
FIG. 18 illustrates an example of the configuration of a voltage output circuit in an example of the power amplifier circuit shown in FIG. 14.
Figure 19:
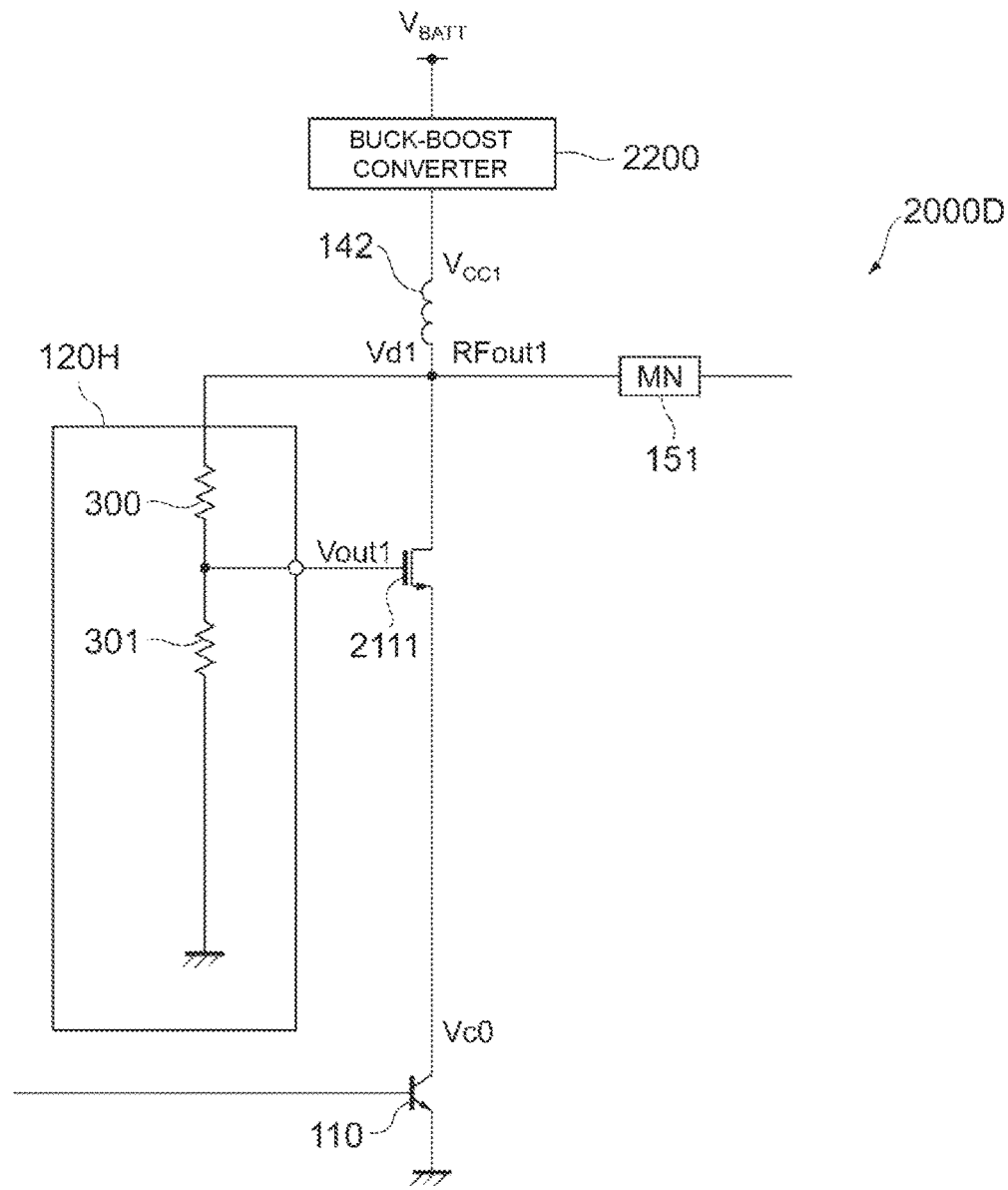
FIG. 19 illustrates another example of the configuration of the power amplifier circuit according to the second embodiment.

FIG. 15 illustrates an example of the configuration of the voltage output circuit 120 (voltage output circuit 120H) in a power amplifier circuit 2000A, which is an example of the power amplifier circuit 2000. For the sake of representation, among the elements forming the power amplifier circuit 2000A, elements related to the drive-stage amplifier are only shown in FIG. 15. FIGS. 17 through 19 are illustrated in a similar manner. The same elements as those of the power amplifier circuit 100A are designated by like reference numerals, and an explanation thereof will be omitted.

The voltage output circuit 120H is different from the voltage output circuit 120A shown in FIG. 4 in that it does not include the limiter circuit 310A. That is, the node between the series-connected resistor elements 300 and 301 is connected to the gate of the FET 2111. The voltage obtained by dividing the drain voltage Vd1 (which varies in accordance with the power supply voltage $V_{CC1}$) of the FET 2111 in accordance with the resistance values of the resistor elements 300 and 301 is output from the voltage output circuit 120H as the output voltage Vout1 (first voltage). As will be discussed later, the output voltage Vout1 output from the voltage output circuit 120H may be lower than that from the voltage output circuit 120A. Because of this reason, the voltage output circuit 120H does not include the limiter circuit 310A. This, however, does not intend to exclude a configuration in which the voltage output circuit 120H includes the limiter circuit 310A.

The FET 2111 is a depletion GaAs high-electron-mobility transistor (HEMT), for example. The depletion HEMT operates in a region where the gate-source voltage Vgs is negative (that is, the threshold voltage is about 0 V or lower). The threshold voltage is a gate-source voltage when a FET switches from OFF to ON. A drain current in the depletion HEMT increases as the gate-source voltage Vgs increases from a negative value to 0, and becomes maximum when the gate-source voltage Vgs reaches 0 V. That is, when the maximum current flows through the FET 2111, the gate-source voltage Vgs is 0 V. When the collector voltage (about 0.5 V, for example) of the lower-stage bipolar transistor 110 is represented by Vc0 and a voltage drop caused by the resistor element 300 is represented by Vr, the drain voltage Vd1 necessary for allowing a high current to flow through the power amplifier circuit 2000A is expressed by Vd1=Vc0+Vgs+Vr=Vc0+Vr.

In the power amplifier circuit 100A shown in FIG. 4, the upper-stage transistor is a bipolar transistor (bipolar transistor 111). The base-emitter voltage for turning ON the bipolar transistor 111 is required to be equal to or higher than the ON-state voltage (about 1.3 V, for example). When the ON-state voltage of the bipolar transistor 111 is represented by Von, the collector voltage Vc1 necessary for allowing a high current to flow through the power amplifier circuit 100A is expressed by Vc1=Vc0+Von+Vr. Because of this reason, the power amplifier circuit 2000A is operable with a drain voltage Vd1 of the upper-stage FET 2111, which is lower than the collector voltage Vc1 of the bipolar transistor 111 by an amount equal to the base-emitter ON-state voltage. In other words, the power amplifier circuit 2000A is capable of outputting substantially the same level of current as that from the power amplifier circuit 100A by using a power supply voltage $V_{CC1}$ lower than that in the power amplifier circuit 100A.

Figure 16A:
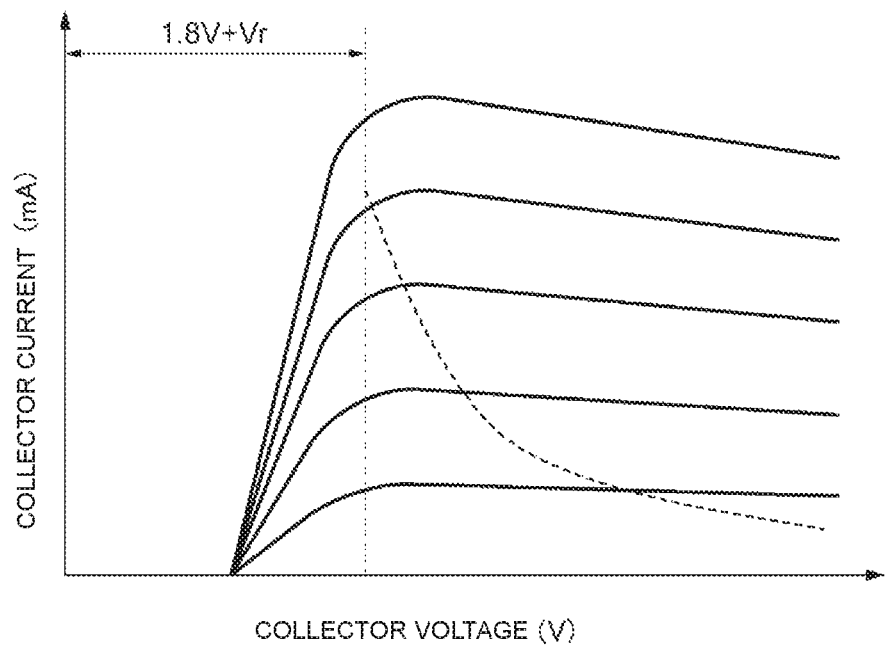
FIG. 16A is a graph illustrating the relationship between a collector voltage and a collector current of a bipolar transistor in the power amplifier circuit shown in FIG. 4.

FIG. 16A is a graph illustrating the relationship between the collector voltage and the collector current of the bipolar transistor 111 in the power amplifier circuit 100A. In FIG. 16A, the vertical axis indicates the collector current (mA) of the bipolar transistor 111, while the horizontal axis indicates the collector voltage (V) thereof. This graph illustrates the relationship between the collector voltage and the collector current (indicated by the solid lines) when the base current is varied. The graph also illustrates a path of the collector voltage and the collector current (indicated by the dashed line) when power output is constant.

Figure 16B:
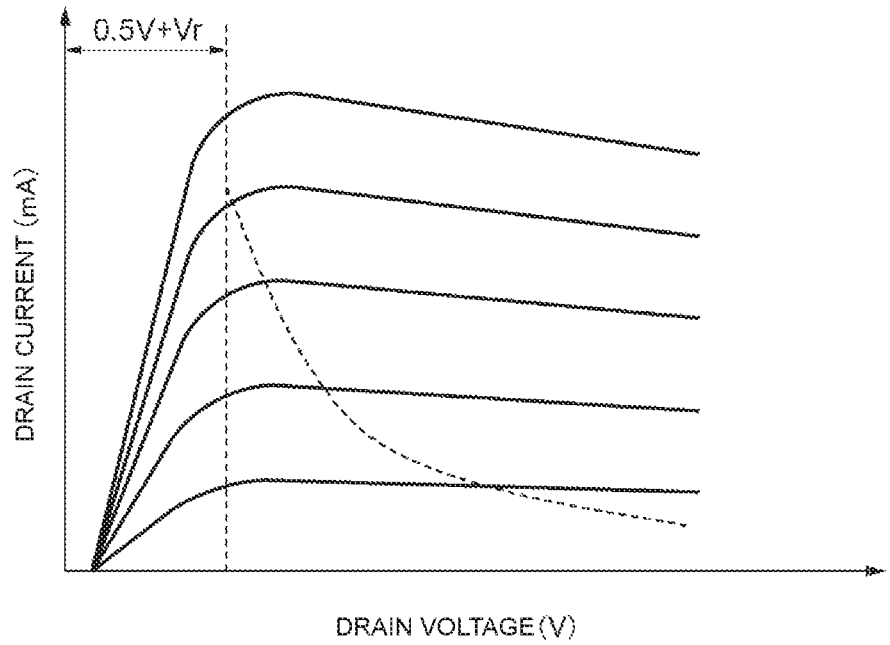
FIG. 16B is a graph illustrating the relationship between a drain voltage and a drain current of a field-effect transistor (FET) in the power amplifier circuit shown in FIG. 15.

FIG. 16B is a graph illustrating the relationship between the drain voltage and the drain current of the FET 2111 in the power amplifier circuit 2000A. In FIG. 16B, the vertical axis indicates the drain current (mA) of the FET 2111, while the horizontal axis indicates the drain voltage (V) thereof. This graph illustrates the relationship between the drain voltage and the drain current (indicated by the solid lines) when the gate voltage is varied. The graph also illustrates a path of the drain voltage and the drain current (indicated by the dashed line) when power output is constant. The graphs illustrated in FIGS. 16A and 16B show the states when the collector voltage Vc0 of the lower-stage bipolar transistor 110 is about 0.5 V and the base-emitter ON-state voltage of the upper-stage bipolar transistor 111 is about 1.3 V when the amplifier is in operation.

The two graphs in FIGS. 16A and 16B show that the drain voltage in the power amplifier circuit 2000A shifts to the lower voltage side than the collector voltage in the power amplifier circuit 100A by about 1.8−0.5=about 1.3 V with respect to substantially the same output current. 1.3 V corresponds to the base-emitter voltage in the upper-stage bipolar transistor 111.

As stated above, the power amplifier circuit 2000A is capable of outputting substantially the same level of current as that from the power amplifier circuit 100A by using a power supply voltage $V_{CC1}$ lower than that in the power amplifier circuit 100A. The power amplifier circuit 2000A is therefore able to improve power-added efficiency to be higher than the power amplifier circuit 100A.

The upper-stage transistor is not limited to a depletion HEMT, and may be a metal-semiconductor field-effect transistor (MESFET), a metal-oxide-semiconductor field-effect transistor (MOSFET), or a junction gate field-effect transistor (JFET). The use of a depletion FET makes it possible to operate a power amplifier circuit by using a lower power supply voltage $V_{CC1}$. This, however, does not intend to exclude a configuration in which an enhancement FET is used as the upper-stage transistor.

FIG. 17 illustrates an example of the configuration of the voltage output circuit 120 (voltage output circuit 1201) in a power amplifier circuit 2000B, which is an example of the power amplifier circuit 2000. The same elements as those of the power amplifier circuit 100A are designated by like reference numerals, and an explanation thereof will be omitted. The voltage output circuit 1201 is different from the voltage output circuit 120E shown in FIG. 10 in that it does not include the limiter circuit 310A. The configuration of the other elements and advantages are similar to those of the voltage output circuit 120E, and a detailed explanation thereof will be omitted.

With this configuration, the power amplifier circuit 2000B is capable of outputting substantially the same level of current as that from the power amplifier circuit 100E by using a power supply voltage $V_{CC1}$ lower than that in the power amplifier circuit 100E. The power amplifier circuit 2000B is therefore able to improve the power-added efficiency to be higher than the power amplifier circuit 100E.

FIG. 18 illustrates an example of the configuration of the voltage output circuit 120 (voltage output circuit 120J) in a power amplifier circuit 2000C, which is an example of the power amplifier circuit 2000. The same elements as those of the power amplifier circuit 100A are designated by like reference numerals, and an explanation thereof will be omitted. The voltage output circuit 120J is different from the voltage output circuit 120F shown in FIG. 11 in that it does not include the limiter circuit 310A. The configuration of the other elements and advantages are similar to those of the voltage output circuit 120F, and a detailed explanation thereof will be omitted.

With this configuration, too, the power amplifier circuit 2000C is capable of outputting substantially the same level of current as that from the power amplifier circuit 100F by using a power supply voltage $V_{CC1}$ lower than that in the power amplifier circuit 100F. The power amplifier circuit 2000C is therefore able to improve the power-added efficiency to be higher than the power amplifier circuit 100F.

FIG. 19 illustrates another example of the configuration of the power amplifier circuit 2000 (power amplifier circuit 2000D) according to the second embodiment. The same elements as those of the power amplifier circuit 2000A are designated by like reference numerals, and an explanation thereof will be omitted. The power amplifier circuit 2000D is different from the power amplifier circuit 2000A in that the power supply voltage $V_{CC1}$ to be supplied to the drain of the FET 2111 is generated by a buck-boost converter 2200.

As described above, the power amplifier circuit 2000 is capable of outputting substantially the same level of output power as that from the power amplifier circuit 100 by using a power supply voltage $V_{CC1}$ lower than that in the power amplifier circuit 100. When the power amplifier circuit 2000D operates in a low output power mode, the buck-boost converter 2200 steps down the battery voltage $V_{BATT}$ and supplies it to the FET 2111 as the power supply voltage $C_{CC1}$ thereby further improving the power-added efficiency.

When the power amplifier circuit 2000D operates in a high output power mode, the buck-boost converter 2200 steps up the battery voltage $V_{BATT}$ and supplies it to the FET 2111 as the power supply voltage $V_{CC1}$. If the upper-stage transistor is a bipolar transistor, with a temperature rise due to a current increase and an increased emitter-collector voltage, thermal runaway may occur and the transistor may be broken. In contrast, in a FET, even with a temperature rise due to a current increase and an increased drain-source voltage, the parasitic resistance of the FET increases, and thermal runaway is less likely to occur. That is, even with an increased power supply voltage, the FET in the power amplifier circuit 2000D is less likely to be broken than the bipolar transistor in the power amplifier circuit 100A. When the power amplifier circuit 2000D operates in the high output power mode, the power supply voltage $V_{CC1}$ stepped up from the battery voltage $V_{BATT}$ by the buck-boost converter 2200 is supplied to the FET 2111. As a result, in the power amplifier circuit 2000D, the power-added efficiency can be improved while the reliability is being maintained.

In this manner, the power amplifier circuit 2000D is able to supply a stepped-down or stepped-up power supply voltage in accordance with the level of output power. In the power amplifier circuit 2000D, instead of the buck-boost converter 2200, a buck converter or a boost converter may be used.

The configuration of the second embodiment (that is, the configuration in which the cascode-connected upper-transistor is a FET) applied to the power amplifier circuit is 2000A through 2000D may also be applied to the first embodiment.

The exemplary embodiments of the disclosure have been discussed. The power amplifier circuits 100A through 100H include the bipolar transistors 110 and 111 and the voltage output circuits 120A through 120G. A RF signal is input into the bases of the bipolar transistors 110. The bipolar transistors 111 are cascode-connected to the bipolar transistors 110. The voltage output circuits 120A through 120G supply the output voltage Vout1 corresponding to the power supply voltage $V_{CC1}$ to the bases of the bipolar transistors 111. The voltage obtained by substantially equally dividing the power supply voltage $V_{CC1}$ by the number of bipolar transistors is applied between the collector and the emitter of each bipolar transistor. The bipolar transistors are thus less likely to be broken. It is thus possible to supply a higher power supply voltage than in a configuration in which bipolar transistors are not cascode-connected. As a result, the power-added efficiency can be improved while the reliability is being maintained.

In the power amplifier circuits 100A through 100H, the voltage output circuits 120A through 120G include the limiter circuits 310A through 310E that control the output voltage Vout1 at a predetermined level or higher so as to turn ON the bipolar transistors 111. The output voltage Vout1 is maintained at a predetermined level or higher even when the collector voltage Vc1 of the bipolar transistors 111 is reduced. Thus, the bipolar transistors 111 are maintained in the ON state even with a decrease in the power supply voltage $V_{CC1}$. The effect of cascode-connecting the bipolar transistor 111 can thus be fulfilled.

In the power amplifier circuits 100A through 100H, the voltage output circuits 120A through 120G include the series-connected resistor elements 300 and 301. The output voltage Vout1 is output from the node between the resistor elements 300 and 301. Adjusting of the resistance values of the resistor elements 300 and 301 can change the distribution ratio of the voltages applied to the bipolar transistors 110 and 111.

As shown in FIGS. 4, 6, 8 through 11, and 13, the limiter circuits 310A through 310D may include the diode 320 connected in series with the resistor elements 300 and 301. The configuration of the limiter circuits 310A through 310D is not restricted to this example.

In the power amplifier circuit 100D, the limiter circuit 310D includes the capacitor 800 between the anode of the diode 320 and a ground. With this configuration, a RF signal which is accidentally input into the voltage output circuit 120D is grounded by the capacitor 800, and the forward voltage Vf of the diode 320 is less likely to change. It is thus less likely that output power will be reduced when a high level signal is input.

In the power amplifier circuits 100B through 100D, and 100H, the voltage output circuits 120B through 120D also include the bipolar transistor 500 that allows or stops the flowing of a current through the resistor elements 300 and 301 in accordance with the control voltage Vsw. The collector-emitter voltage of the bipolar transistor 500 is added to the output voltage Vout1. A decrease in the output voltage Vout1 is thus less likely to occur than in the power amplifier circuit 100A. A decrease in output power of the bipolar transistor 111 is also less likely to occur when a high level signal is input. Additionally, it is possible to stop a current from flowing through the voltage output circuits 120B through 120D when the amplifier is OFF, thereby reducing the standby current in the power amplifier circuits 100B through 100D, and 100H.

In the power amplifier circuit 100C, the limiter circuit 310C includes the current output circuit 700 that supplies an additional current to the anode of the diode 320. With the provision of the current output circuit 700, even with a sharp fluctuation in the amplitude of a RF signal in response to input of a high level signal, the diode 320 is maintained in the ON state, and output power is less likely to be reduced.

As shown in FIG. 8, the current output circuit 700 includes the bipolar transistor 711 that outputs a current from the emitter to the diode 320 in accordance with the control voltage Vsw. The configuration of the current output circuit 700 is not restricted to this example.

In the power amplifier circuit 100E, the voltage output circuit 120E includes the series-connected resistor element 900 and capacitor 910 between a ground and a node between the resistor elements 300 and 301. Adjusting of the resistance value of the resistor element 900 and the capacitance value of the capacitor 910 can independently set the division ratio of the DC voltage and that of the AC voltage of the output voltage Vout1. The fluctuation in the amplitude of the output voltage Vout1 can thus be controlled. It is thus less likely that output power will be reduced when a high level signal is input.

The power amplifier circuit 100H includes an amplifier (without necessarily a cascode-connected bipolar transistor), which is connected in parallel with the amplifier (with cascode-connected bipolar transistors) shown in FIG. 6, in addition to the elements forming the power amplifier circuit 100A. When the power supply voltage $V_{CC1}$ is high, the amplifier with cascode-connected bipolar transistors is operated, and when the power supply voltage $V_{CC1}$ is low, the amplifier without necessarily a cascode-connected bipolar transistor is operated. The power amplifier circuit 100H is thus capable of switching the amplifier which will operate in accordance with a change in the power supply voltage $V_{CC1}$. This increases the operating range of the power supply voltage supported by the power amplifier circuit 100H to be wider than that by the power amplifier circuit 100A.

The power amplifier circuits 2000A through 2000D include the bipolar transistors 110, the FETs 2111, and the voltage output circuits 120H through 120J. A RF signal is input into the bases of the bipolar transistors 110. The FETs 2111 are cascode-connected to the bipolar transistors 110. The voltage output circuits 120H through 120J supply the output voltage Vout1 corresponding to the power supply voltage $V_{CC1}$ to the gates of the FETs 2111. The power amplifier circuits 2000A through 2000D are thus capable of outputting substantially the same level of current as that from the power amplifier circuit 100 by using the power supply voltage lower than that in the power amplifier circuit 100. The power amplifier circuits 2000A through 2000D are therefore able to improve power-added efficiency to be higher than the power amplifier circuit 100.

The FETs 2111 and 2113 are not limited to a particular type. For example, a depletion FET having a threshold voltage of 0 V or lower may be used. The use of a depletion FET makes it possible to operate a power amplifier circuit by using lower power supply voltages $V_{CC1}$ and $V_{CC2}$.

The power amplifier circuit 2000D also includes the buck-boost converter 2200. The power amplifier circuit 2000D is able to supply a stepped-down or stepped-up power supply voltage in accordance with the level of output power. Regardless of whether a stepped-down or stepped-up power supply voltage is supplied, the power-added efficiency can be improved.

In the power amplifier circuits 100A through 100H and 2000A through 2000D, the amplifier constituted by cascode-connected transistors is applied to the drive stage. However, such an amplifier may be applicable to the power stage or to both of the drive stage and the power stage.

In the above-described embodiments, the power amplifier circuits have two stages of amplifiers. However, one stage of amplifier or three or more stages of amplifiers may be used. If plural stages of amplifiers are used, an amplifier constituted by cascode-connected transistors may be applicable to any stage.

The elements of the power amplifier circuits 100A through 100H may be combined with each other. In one example, in the power amplifier circuit 100H shown in FIG. 13, the voltage output circuit 120B may be replaced by the voltage output circuit 120E shown in FIG. 10. In another example, the power supply voltage $V_{CC1}$ may not be supplied via the inductor 142, but be supplied directly to the voltage output circuits 120A through 120G. Combinations of the elements are not restricted to these examples.

The above-described embodiments are provided for facilitating the understanding of the invention, but are not intended to be exhaustive or to limit the invention to the precise forms disclosed. Modifications and/or improvements may be made without departing from the scope and spirit of the invention, and equivalents of the invention are also encompassed in the invention. That is, suitable design changes made to the embodiments by those skilled in the art are also encompassed in the invention within the scope and spirit of the invention. For example, the elements of the embodiments and the positions, materials, conditions, configurations, and sizes thereof are not restricted to those described in the embodiments and may be changed in an appropriate manner. The elements of the embodiments may be combined within a technically possible range, and configurations obtained by combining the elements of the embodiments are also encompassed in the invention within the scope and spirit of the invention.

While preferred embodiments of the invention have been described above, it is to be understood that variations and modifications will be apparent to those skilled in the art without departing from the scope and spirit of the invention. The scope of the invention, therefore, is to be determined solely by the following claims.

What is claimed is:

1. A power amplifier circuit comprising:
    a first transistor, a radio frequency signal being input into a base of the first transistor;
    a first voltage output circuit configured to output a first voltage in accordance with a power supply voltage; and
    a second transistor, wherein:
    the first voltage is supplied to a base or a gate of the second transistor,
    an emitter or a source of the second transistor is connected to a collector of the first transistor,
    a first amplified signal generated by amplifying the radio frequency signal is output from a collector or a drain of the second transistor, and
    the first voltage output circuit comprises:
        a limiter circuit that controls the first voltage at or above a predetermined level so as to turn ON the second transistor,
        a first resistor, and
        a second resistor,
        wherein the first resistor and the second resistor are connected in series with each other, and the first voltage is output from a node between the first resistor and the second resistor, and
        wherein the limiter circuit comprises a diode connected to ground in series with the first resistor and the second resistor, and a third transistor configured to cause a current to flow through the first resistor and the second resistor based on a control signal that turns ON the third transistor.

2. The power amplifier circuit according to claim 1, wherein the limiter circuit further comprises a first capacitor disposed between an anode of the diode and ground.

3. The power amplifier circuit according to claim 1, wherein the limiter circuit further comprises a current output circuit configured to supply a first current to an anode of the diode based on the control signal that turns ON the third transistor.

4. The power amplifier circuit according to claim 3, wherein the current output circuit comprises a fourth transistor that is turned ON when the control signal turns ON the third transistor and that outputs the first current from an emitter of the fourth transistor so as to turn ON the diode.

5. The power amplifier circuit according to claim 1,
wherein the first voltage output circuit further comprises a third resistor and a second capacitor, and
wherein the third resistor and the second capacitor are connected in series between ground and a node between the first resistor and the second resistor.

6. The power amplifier circuit according to claim 1, further comprising:
a fifth transistor, the radio frequency signal being input into a base of the fifth transistor, an emitter of the fifth transistor being grounded, and the first amplified signal being output from a collector of the fifth transistor;
a first bias circuit configured to supply a first bias current or voltage to the base of the first transistor;
a second bias circuit configured to supply a second bias current or voltage to the base of the fifth transistor; and
a switch circuit configured to stop supply of the first bias current or voltage when a value of the power supply voltage is a first level, and configured to stop supply of the second bias current or voltage when the value of the power supply voltage is a second level,
wherein the second level is higher than the first level.

7. The power amplifier circuit according to claim 1, further comprising:
a sixth transistor, the first amplified signal being input into a base of the sixth transistor;
a second voltage output circuit configured to output a second voltage in accordance with the power supply voltage; and
a seventh transistor, wherein:
the second voltage is supplied to a base or a gate of the seventh transistor,
an emitter or a source of the seventh transistor is connected to a collector of the sixth transistor, and
a second amplified signal generated by amplifying the first amplified signal is output from a collector or a drain of the seventh transistor.

8. The power amplifier circuit according to claim 7, wherein the sixth transistor is a bipolar transistor and the seventh transistor is a field-effect transistor.

9. The power amplifier circuit according to claim 8, wherein the seventh transistor is a depletion field-effect transistor having a threshold voltage of 0 V or lower.

10. The power amplifier circuit according to claim 1, wherein the first transistor is a bipolar transistor and the second transistor is a field-effect transistor.

11. The power amplifier circuit according to claim 10, wherein the second transistor is a depletion field-effect transistor having a threshold voltage of 0 V or lower.

12. The power amplifier circuit according to claim 1, wherein the power supply voltage is generated by a buck-boost DC-to-DC converter.

13. The power amplifier circuit according to claim 1, further comprising an inductor, a first end of the inductor being connected to the power supply voltage and a second end of the inductor being connected to the collector or the drain of the second transistor, and wherein the first resistor is connected to the second end of the inductor.

14. The power amplifier circuit according to claim 1, further comprising an inductor, a first end of the inductor being connected to the power supply voltage and a second end of the inductor being connected to the collector or the drain of the second transistor, and wherein the first resistor is connected to the first end of the inductor.

15. The power amplifier circuit according to claim 1, wherein the limiter circuit comprises:
a fourth resistor connected to ground in series with the first resistor and the second resistor;
a third capacitor disposed between ground and a node between the second resistor and the fourth resistor; and
a current output circuit configured to supply a first current to the node between the second resistor and the fourth resistor.

16. The power amplifier circuit according to claim 1, further comprising:
a fifth transistor, the radio frequency signal being input into a base of the fifth transistor, an emitter of the fifth transistor being grounded, and the first amplified signal being output from a collector of the fifth transistor; and
a switch circuit configured to ground the base of the first transistor when a value of the power supply voltage is a first level, and configured to ground the base of the fifth transistor when the value of the power supply voltage is a second level, wherein the second level is higher than the first level.

* * * * *

UNITED STATES PATENT AND TRADEMARK OFFICE
CERTIFICATE OF CORRECTION

PATENT NO. : 10,177,724 B2
APPLICATION NO. : 15/600993
DATED : January 8, 2019
INVENTOR(S) : Satoshi Tanaka et al.

Page 1 of 1

It is certified that error appears in the above-identified patent and that said Letters Patent is hereby corrected as shown below:

In the Specification

Column 14, Line 42, "1201" should be -- 120I --.

Column 14, Line 47, "1201" should be -- 120I --.

Column 15, Line 28, "$C_{CC1}$" should be -- $V_{CC1}$ --.

Signed and Sealed this
Sixteenth Day of July, 2019

Andrei Iancu
*Director of the United States Patent and Trademark Office*